US009690650B2

(12) United States Patent
Liu et al.

(10) Patent No.: US 9,690,650 B2
(45) Date of Patent: Jun. 27, 2017

(54) STORAGE SCHEME FOR BUILT-IN ECC OPERATIONS

(71) Applicant: Macronix International Co., Ltd., Hsinchu (TW)

(72) Inventors: Yi-Ching Liu, Hsinchu (TW); Chi Lo, Hsinchu (TW); Shuo-Nan Hung, Jhubei (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 382 days.

(21) Appl. No.: 13/951,130

(22) Filed: Jul. 25, 2013

(65) Prior Publication Data

US 2014/0258811 A1 Sep. 11, 2014

Related U.S. Application Data

(60) Provisional application No. 61/775,699, filed on Mar. 11, 2013.

(51) Int. Cl.
| | |
|---|---|
| *G11C 29/00* | (2006.01) |
| *G06F 11/10* | (2006.01) |
| *G11B 20/18* | (2006.01) |
| *G11C 7/10* | (2006.01) |

(52) U.S. Cl.
CPC ...... *G06F 11/1044* (2013.01); *G06F 11/1008* (2013.01); *G06F 11/1068* (2013.01); *G11B 20/1833* (2013.01); *G11C 7/1006* (2013.01)

(58) Field of Classification Search
CPC ............. G06F 11/1008; G06F 11/1076; G06F 11/1068; G06F 11/1044; G11B 20/1833

USPC .......................................... 714/752, 763, 766
See application file for complete search history.

(56) References Cited

U.S. PATENT DOCUMENTS

| | | | | | |
|---|---|---|---|---|---|
| 5,608,673 | A | * | 3/1997 | Rhee .................. | G11C 16/08 365/185.17 |
| 5,627,968 | A | * | 5/1997 | Ozaki ................. | G06F 13/1673 709/212 |
| 8,261,008 | B2 | | 9/2012 | Que | |
| 8,375,273 | B2 | | 2/2013 | Hara | |
| 2002/0184592 | A1 | * | 12/2002 | Koga .................. | G06F 11/1032 714/763 |
| 2003/0093744 | A1 | * | 5/2003 | Leung ................. | G06F 11/1048 714/763 |

(Continued)

*Primary Examiner* — Albert Decady
*Assistant Examiner* — Osman M Alshack
(74) *Attorney, Agent, or Firm* — Yiding Wu; Haynes Beffel & Wolfeld LLP

(57) ABSTRACT

A device includes a memory array storing data and error correcting codes ECCs corresponding to the data, and a multi-level buffer structure between the memory array and an input/output data path. The memory array includes a plurality of data lines for page mode operations. The buffer structure includes a first buffer having storage cells connected to respective data lines in the plurality of data lines for a page of data, a second buffer coupled to the storage cells in the first buffer for storing at least one page of data, and a third buffer coupled to the second buffer and to the input/output data path. The device includes logic coupled to the multi-level buffer to perform a logical process over pages of data during movement between the memory array and the input/output path through the multi-level buffer for at least one of page read and page write operations.

18 Claims, 16 Drawing Sheets

(56) References Cited

U.S. PATENT DOCUMENTS

| | | | | |
|---|---|---|---|---|
| 2003/0106010 A1* | 6/2003 | Fujioka | ............... | G06F 11/106 714/763 |
| 2005/0080954 A1* | 4/2005 | Castro | ............... | G06F 13/4059 710/52 |
| 2006/0041711 A1* | 2/2006 | Miura | ............... | G11C 11/4072 711/103 |
| 2006/0095535 A1* | 5/2006 | Govindaraju | ........... | H04L 47/10 709/217 |
| 2007/0198902 A1* | 8/2007 | Toda | .................. | H03M 13/152 714/782 |
| 2009/0193308 A1* | 7/2009 | Habermann | ........ | H04L 41/0654 714/746 |
| 2010/0284228 A1* | 11/2010 | Kodama | ............. | G11C 7/1006 365/189.05 |
| 2013/0286752 A1* | 10/2013 | Michioka | ............. | G11C 7/1006 365/189.05 |

\* cited by examiner

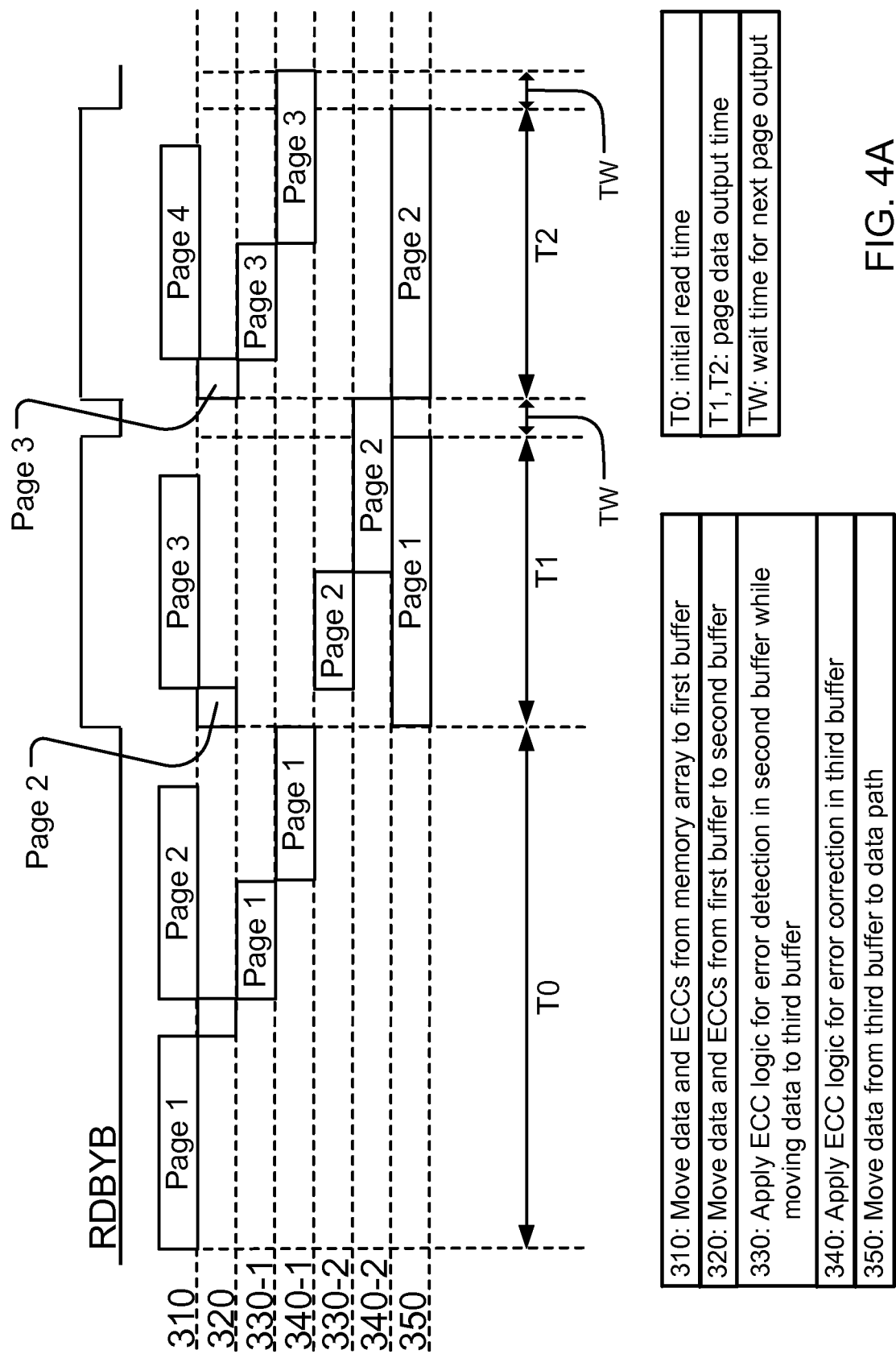

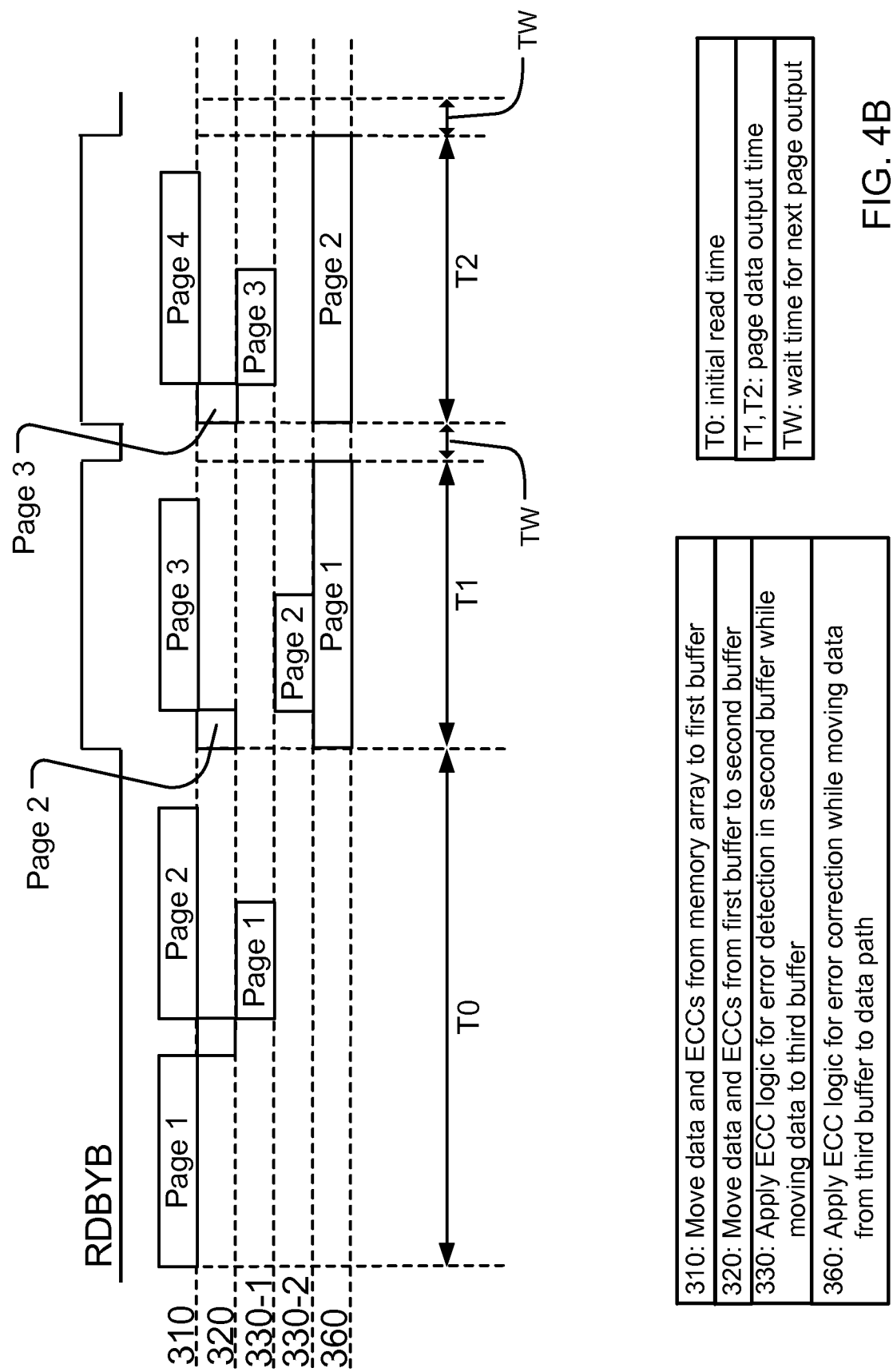

STORAGE SCHEME FOR BUILT-IN ECC OPERATIONS

CROSS-REFERENCE TO RELATED APPLICATIONS

This application claims the benefit of U.S. Provisional Patent Application No. 61/775,699, filed 11 Mar. 2013.

BACKGROUND OF THE INVENTION

Field of the Invention

The present invention relates to integrated circuit memory devices, and to circuitry using error correcting codes ECCs.

Description of Related Art

High density memory devices are being designed that include arrays of flash memory cells, or other types of memory cells. In one example, a memory device includes a memory array storing data pages and error correcting codes ECCs for corresponding data pages. The device includes ECC logic to detect and correct errors in the corresponding data pages using the ECCs. The device includes a page buffer coupled to the memory array, to the ECC logic, and to a data path. The page buffer includes sense amplifiers for read operations, a program buffer for write operations, and a cache for read and write operations on data in a data page.

For read operations, data from a data page and error correcting codes ECCs for the page are moved from the memory array to the sense amplifiers, and then from the sense amplifiers to the cache. If the ECC logic is enabled, the ECC logic is then applied on the data using corresponding ECCs, and corrected data is stored in the cache. Corrected data is then moved from the cache to the data path. However, data from a next data page cannot be moved to the cache until after the corrected data in the cache has been moved from the cache to the data path. This results in a lower read throughput for the memory device.

It is desirable to improve the read throughput of a memory device that uses built-in error correcting codes ECCs.

SUMMARY

A device includes a memory array storing data and error correcting codes ECCs corresponding to the data, an input/output data path, and a multi-level buffer structure between the memory array and the input/output data path. The memory array includes a plurality of data lines for page mode operations. The buffer structure includes a first buffer having storage cells connected to respective data lines in the plurality of data lines for a page of data, a second buffer coupled to the storage cells in the first buffer for storing at least one page of data, and a third buffer coupled to the second buffer and to the input/output data path. The device includes logic coupled to the multi-level buffer to perform a logical process over pages of data during movement between the memory array and the input/output path through the multi-level buffer for at least one of page read and page write operations.

The device includes an interface between the first buffer and the second buffer that provides for movement of a page of data between the first and second buffers in one read or write cycle. The device also includes an interface between the second buffer and the third buffer that provides for movement of a page of data between the second and third buffers in one read or write cycle. The second buffer stores error correcting codes ECCs for corresponding data.

The third buffer of the buffer structure can include a first memory unit and a second memory unit. The first memory unit is coupled to the second buffer of the buffer structure by a storage bus. The second memory unit is coupled to the second buffer of the buffer structure by the storage bus or by a second storage bus. The device includes logic to move data from the second buffer to one of the first memory unit and the second memory unit, while moving data from another of the first memory unit and the second memory unit to the input/output data path.

The device includes ECC logic to detect and correct errors in the data using the corresponding ECCs. The device includes a controller coupled to the multi-level buffer structure, the ECC logic and the memory array. The ECC logic can include logic to move data of a sequence of pages from the memory array, including logic for time-overlapping operations to move error corrected data of a first page from the third buffer to the data path, to move data of a second page from the second buffer to the third buffer, to move data of a third page from the first buffer to the second buffer, and to apply the ECC logic for error detection to data of pages in the sequence before the data is moved out of the second buffer.

The ECC logic can be applied for error correction to data of pages in the sequence before the data is moved out of the third buffer or while the data is moved from one of the first memory unit and the second memory unit to the input/output data path.

The device can include logic to move data from one of the first memory unit and the second memory unit to the second buffer, while moving data from the input/output data path to another of the first memory unit and the second memory unit.

The ECC logic can include logic to move data of a sequence of pages to the memory array, including logic for time-overlapping operations to move data of a second page from the data path to the third buffer, to move data of the second page from the third buffer to the second buffer with ECCs computed by the ECC logic, to move data of a first page out of the first buffer to the memory array with the ECCs, to move data of the second page from the second buffer to the first buffer, and to apply the ECC logic to compute an ECC for data of pages in the sequence before the data is moved out of the second buffer.

Other aspects and advantages of the present invention can be seen on review of the drawings, the detailed description and the claims, which follow.

BRIEF DESCRIPTION OF THE DRAWINGS

FIG. 4A is an example timing diagram illustrating read operations associated with the first embodiment with ECC enabled.

FIG. 4B is an example timing diagram illustrating alternative read operations associated with the first embodiment with ECC enabled.

DETAILED DESCRIPTION

Figure 1:
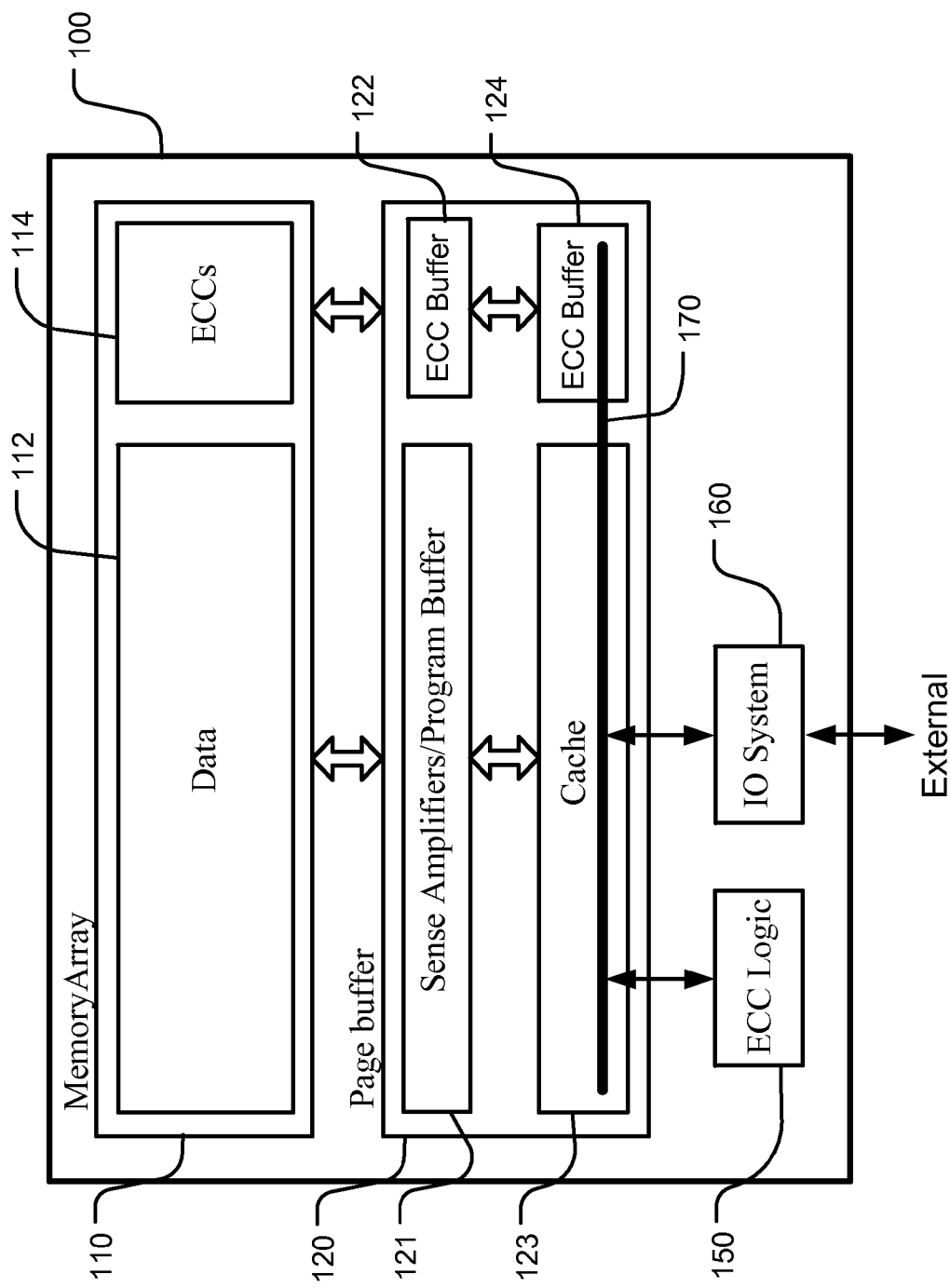
FIG. 1 is a block diagram illustrating a memory device using built-in error correcting codes ECCs (prior art).

A detailed description of embodiments of the present invention is provided with reference to FIGS. 1-14.

As used in the present application, a bit is the basic unit of digital data in the memory array. A bit can have only two possible values: either digital one (1) or zero (0). A byte is a unit of digital data in the memory array. A byte contains 8 bits. A word is a unit of digital data in the memory array. A word contains 2 bytes corresponding to 16 bits. A page as used herein refers to an amount of data that is stored in a second buffer or a third buffer in a multi-level buffer structure, on which the ECC logic is applied to either compute ECCs for write operations, or detect and correct errors using the ECCs for read operations. A page can have a fixed size such as 2,048 bytes where each byte has 8 bits. A first page, a second page, a third page, etc., refer to the relative order in which the ECC logic is applied on the data pages, where the order is not associated with any logical or physical locations of data in the memory array.

FIG. 1 is a block diagram illustrating a memory device using built-in error correcting codes ECCs (prior art). A memory device 100 includes a memory array 110 storing data 112 and error correcting codes ECCs 114 for corresponding data. The device 100 includes ECC logic 150 to detect and correct errors in the corresponding data using the ECCs. The device 100 includes a page buffer 120 coupled to the memory array 110, to the ECC logic 150, and to a data path 170. The page buffer 120 includes sense amplifiers and a program buffer in block 121, and ECC buffer 122 for ECCs corresponding to data stored by the sense amplifiers and the program buffer. The sense amplifiers and the program buffer are coupled with the memory array 110, a cache 123 for processing data in a data page, and an ECC buffer 124 storing ECCs corresponding to the data in cache 123. The data path 170 is coupled to an input/output system 160, which in turn can be coupled to circuitry external to the device 100.

For read operations, data 112 of a data page in the memory array 110 and the error correcting codes ECCs 114 for the data are moved from the memory array 110 to the sense amplifiers for data in block 121 and the ECC buffer 122, respectively. The data and the ECCs of the data page are then moved from the sense amplifiers to the cache 123, and the ECC buffer 124, respectively. If the ECC logic is enabled, the ECC logic 150 is then applied on the data in the cache 123 for error correction using corresponding ECCs. Corrected data is then output from the cache 123 via the data path 170 and the IO system 160. If the ECC logic is not enabled, data is moved from the cache 123 to the data path 170 without correction of errors.

Accordingly, if the ECC logic is enabled, data from a next data page cannot be moved to the cache 123 until after the ECC logic 150 has completed error correction on the data in the cache 123, and the corrected data in the cache 123 has been moved from the cache 123 to the data path 170. The page can have a width (i.e. number of bits) that is much greater than the width of the data path 170. In this case, moving the data out of the cache can take many cycles.

For write operations, data is moved from a source external to the device 100 via the IO system 160 and the data path 170 to the cache 123. If the ECC logic 150 is enabled, the data is then moved from the cache 123 to the program buffer in block 121 with ECCs computed by the ECC logic 150. If the ECC logic is not enabled, the data is then moved from the cache 123 to the program buffer in block 121 without ECCs. The memory array 110 is then programmed with the data from the program buffer in block 121.

If the ECC logic is enabled, since the write throughput of the memory device is dominated by the array programming time, and the memory array can be programmed with data of a data page from the program buffer in block 121, while data for a next data page can be moved from the data path 170 to the cache 123 and then the ECC logic 150 can compute ECCs for the data in the cache 123 for the next data page, thus applying the ECC logic causes less timing impact on the write throughput than on the read throughput of the memory device.

Figure 2:
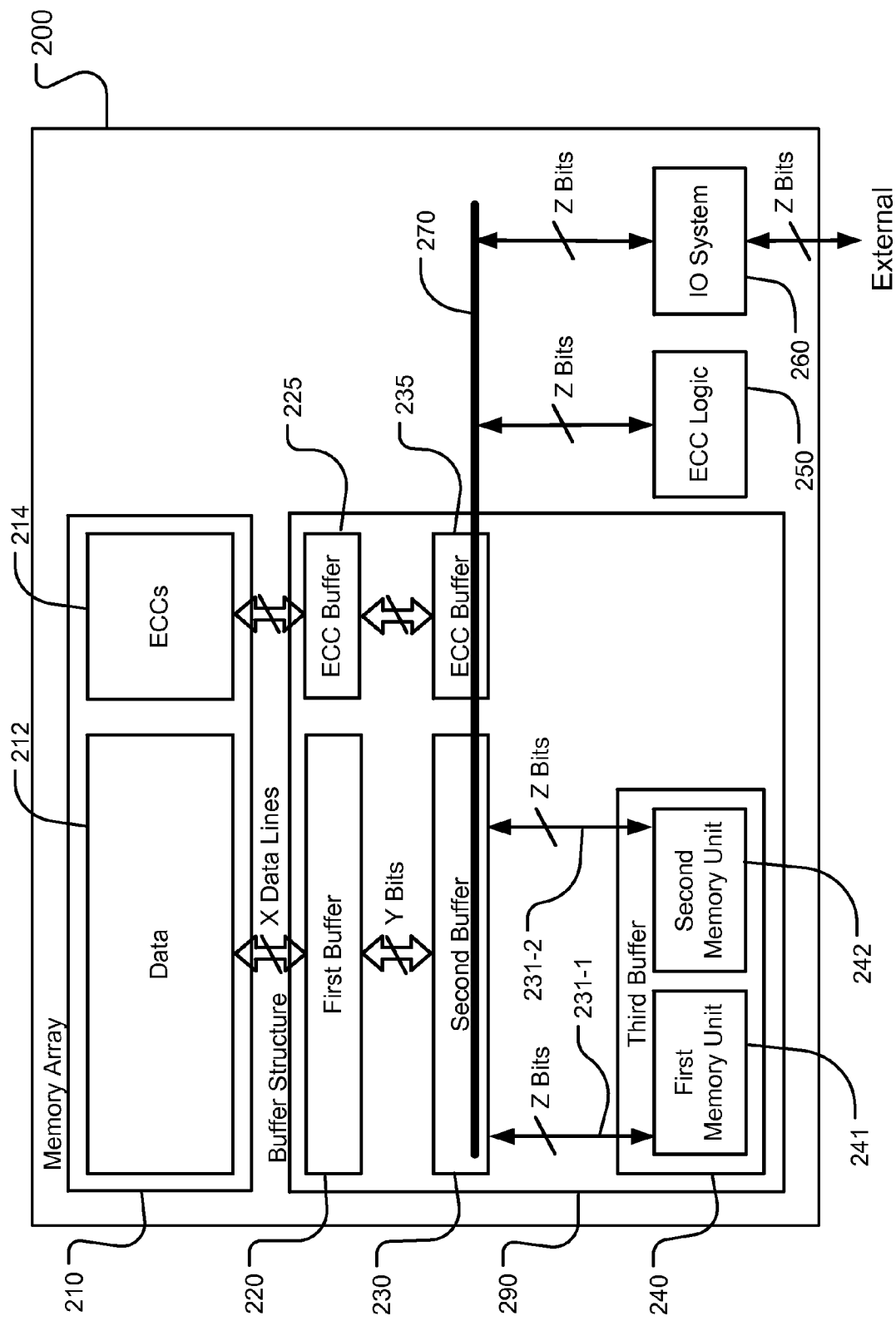
FIG. 2 is a simplified block diagram of a first embodiment of a memory device using built-in error correcting ECC logic.

FIG. 2 is a simplified block diagram of a first embodiment of a memory device 200 using built-in error correcting ECC logic. The memory device 200 includes a memory array 210 storing data 212 and error correcting codes ECCs 214 corresponding to the data, and a multi-level buffer structure 290 between the memory array and an input/output data path 270. The memory array includes a plurality of data lines 211 for page mode operations. The buffer structure includes a first buffer 220 having storage cells connected to respective data lines in the plurality of data lines for a page of data, a second buffer 230 coupled to the storage cells in the first buffer for storing at least one page of data, and a third buffer 240 coupled to the second buffer and to the input/output data path. The device includes logic coupled to the multi-level buffer to perform a logical process over pages of data during movement between the memory array and the input/output path through the multi-level buffer for at least one of page read and page write operations.

The device 200 includes an interface between the first buffer 220 and the second buffer 230 that provides for movement of a page of data between the first and second buffers in one read or write cycle. The device 200 also includes an interface between the second buffer 230 and the third buffer 240 that provides for movement of a page of data between the second and third buffers in one read or write cycle. The second buffer 230 stores error correcting codes ECCs for corresponding data in ECC buffer 235.

The third buffer 240 of the buffer structure 290 in this example includes a first memory unit 241 and a second memory unit 242. The first memory unit 241 is coupled to the second buffer 230 of the buffer structure 290 by a storage bus (e.g. 231-1) and via the data path 270. The second memory unit 242 is coupled to the second buffer 230 of the buffer structure 290 by the storage bus (e.g. 231-1) or by a second storage bus (e.g. 231-2) and via the input/output data path 270. The memory device 200 can include logic to move data from the second buffer to one of the first memory unit and the second memory unit, while moving data from another of the first memory unit and the second memory unit to the input/output data path 270. The second data bus 221 coupling the second buffer 230 to the first buffer 220 has a second data bus width of Y bits greater than a width of Z bits of the input/output data path 270. For instance, the second data bus 221 can have a width of 2048 bits if a page size is 2048 bytes, while the input/output data path 270 can have a width of 8 or 16 bits.

The device includes ECC logic to detect and correct errors in the data using the corresponding ECCs. The device includes a controller (Control Logic in FIG. 14) coupled to the multi-level buffer structure 290, the ECC logic 250 and the memory array 210. The ECC logic can include logic to move data of a sequence of pages from the memory array, including logic for time-overlapping operations to move error corrected data of a first page from the third buffer 240 to the data path 270, to move data of a second page from the second buffer 230 to the third buffer 240, to move data of a third page from the first buffer 220 to the second buffer 230, and to apply the ECC logic 250 for error detection to data of pages in the sequence before the data is moved out of the second buffer 230.

The ECC logic 250 can be applied for error correction to data of pages in the sequence before the data is moved out of the third buffer 240 or while the data is moved from one of the first memory unit 241 and the second memory unit 242 to the input/output data path 270.

The memory device 200 can include logic to move data from one of the first memory unit 241 and the second memory unit 242 to the second buffer 230, while moving data from the input/output data path 270 to another of the first memory unit and the second memory unit.

The ECC logic 250 can include logic to move data of a sequence of pages to the memory array, including logic for time-overlapping operations to move data of a second page from the data path 270 to the third buffer 240, to move data of the second page from the third buffer 240 to the second buffer 230 with ECCs computed by the ECC logic 250, to move data of a first page out of the first buffer 220 to the memory array 210 with the ECCs, to move data of the second page from the second buffer 230 to the first buffer 220, and to apply the ECC logic to compute an ECC for data of pages in the sequence before the data is moved out of the second buffer 230.

The ECC logic 250 on the memory device 200 can support any suitable ECC scheme. Representative ECC schemes include Hamming code, extended Hamming code, multi-dimensional parity-check code, Reed-Solomon code, BCH code (Bose-Chaudhuri-Hocquenghem), Turbo code, and low-density parity-check code. The length of the error correcting code ECC associated with a particular data set depends on 3 factors: (1) ECC scheme; (2) Maximum corrected bit number; (3) Data length of one page. The BCH code is a class of cyclic error-correcting codes that can correct multiple bit errors. For example, to provide maximum corrected bit number of 40 bits in a page of 8 Kilo-bits of data, the length of the BCH ECC code is 560 bits. For another example, to provide maximum corrected bit number of 24 bits in a 8 Kilo-bits page, the length of the BCH ECC code is 336 bits.

The ECC logic 250 is coupled to the data path 270 with a width of Z bits. The data path 270 is coupled to the second buffer 230, the third buffer 240, and an input/output system 260 with a width of Z bits, where Z can be 8 or 16 for example. In read operations, if the ECC logic 250 is enabled, data is moved from the third buffer 240 to the input/output system 260 via the data path 270. In read operations, if the ECC logic 250 is not enabled, data is moved from the second buffer 230 to the input/output system 260 via the data path 270. In write operations, data is moved from the input/output system 260 to the third buffer 240 via the data path 270. The data path 270 with associated control logic configures the buffer structure to allow time-overlapping operations that involve movement of sequences of pages between the second buffer 230 and the third buffer 240, and between one of the two buffers and the input/output system 260. For example, in a write mode, time-overlapping operations can include programming the memory array 210 with data of a first data page from the first buffer 220 while inputting data of a second data page to the third buffer 240. In a read mode, time-overlapping operations can include outputting data from the third buffer 240 while moving data from the memory array 210 to the first buffer 220.

The first buffer 220 is coupled with the memory array 210 via X data lines, and with the second buffer 230 of the buffer structure 290 via a bus of Y bits, where the second buffer 230 can have a width equal to a width of the first buffer 220.

The second buffer 230 can be implemented with a cache memory that has a one row by multiple column architecture. For instance, the second buffer 230 can have one row with 2048 columns or a width of 2048 bits. The first memory unit 241 and the second memory unit 242 can be implemented with SRAMs (static random access memory) that have a multiple row by multiple column architecture. The first memory unit 241 and the second memory unit 242 can have a width equal to the width of the data path 270 and a capacity of up to the width of the second buffer 230 of the buffer structure 290.

Figure 3:
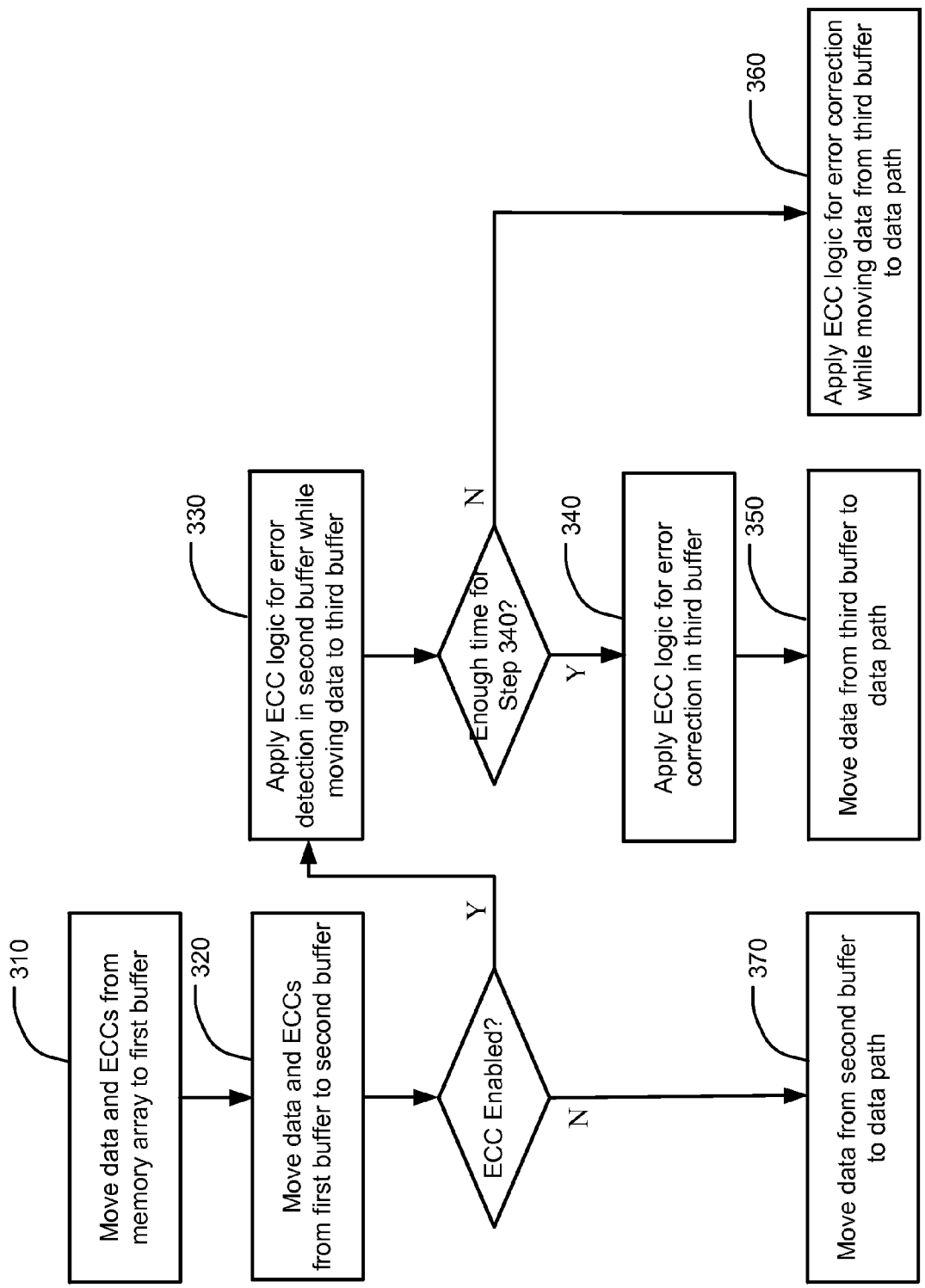
FIG. 3 is an example flowchart illustrating read operations associated with the first embodiment.

FIG. 3 is an example flowchart illustrating read operations of the first embodiment. Data of a data page and corresponding ECCs for the data are moved from the memory array (e.g. 210, FIG. 2) to the first buffer (e.g. 220, FIG. 2) and the ECC buffer (e.g. 225, FIG. 2), respectively (Step 310). The data and the ECCs are then moved from the first buffer and ECC buffer (e.g. 220 and 225) to the second buffer (e.g. 230, FIG. 2) in the buffer structure 290 before error correction using the ECCs, where the ECCs are stored in the ECC buffer (e.g. 235, FIG. 2) associated with the second buffer (Step 320).

If the ECC logic 250 is enabled, the ECC logic is applied on the data of the data page for error detection in the second buffer using corresponding ECCs, while the data of the data page is moved from the second buffer (e.g. 230, FIG. 2) to the first memory unit (e.g. 241, FIG. 2) or the second memory unit (e.g. 242, FIG. 2) in the third buffer (e.g. 240, FIG. 2) (Step 330). After Step 330, the data of the data page is in the third buffer, and the ECC logic has information from error detection for error correction. Error correction can then be executed on the data before the data is moved out of the third buffer, or while the data is moved from one of the first memory unit and the second memory unit to the data path, depending on time allowed by operating specifications for the memory device. If there is enough time, the ECC logic is applied for error correction on the data in the third buffer (Step 340), and the data is then moved from the third buffer to the data path (e.g. 270, FIG. 2) (Step 350). If there is not enough time, the ECC logic is applied for error correction on the data while the data is moved from the third buffer to the data path (e.g. 270, FIG. 2) (Step 360). If the ECC logic is not enabled, data in the data page can be moved from the second buffer to the data path (e.g. 270, FIG. 2), bypassing the third buffer (Step 370).

FIG. 4A is an example timing diagram illustrating read operations associated with the first embodiment with ECC enabled. The timing diagram illustrates time-overlapping read operations for multiple data pages during a first time period T1 and a second time period T2. The first time period T1 and second time period T2 are repeatable for reading more data pages. The first time period T1 and the second time period T2 alternately use the first memory unit (e.g. 241, FIG. 2) and the second memory unit (e.g. 242, FIG. 2) in the third buffer (e.g. 240, FIG. 2). The timing diagram also illustrates read operations during an initial time period T0 prior to the first time period. Signal RDBYB indicates whether the memory device 200 is ready to output data to a data path (e.g. 270 in FIG. 2). Read operations in the timing diagram correspond to Steps 310-340 illustrated in the flowchart in FIG. 3.

During the first time period T1 in FIG. 4A, different time-overlapping read operations can be executed on data of three data pages. Data of a first page, Page 1, is moved from the first memory unit (e.g. 241, FIG. 2) in the third buffer to the data path (e.g. 270, FIG. 2), followed by a wait time, TW, for outputting the next data page (Step 350). Data of a second page, Page 2, is moved from the first buffer (e.g. 220, FIG. 2) to the second buffer (e.g. 230, FIG. 2) (Step 320). The ECC logic is then applied on data of Page 2 for error detection in the second buffer using corresponding ECCs while data of Page 2 is moved from the second buffer to the second memory unit (e.g. 242, FIG. 2) in the third buffer (Step 330). After Step 330, data of Page 2 is in the second memory unit, and the ECC logic has information from error detection for error correction. The ECC logic can then be applied for error correction on data of Page 2 in the second memory unit before the data is moved out of the third buffer (Step 340). Data and corresponding ECCs for a third page, Page 3, are moved from the memory array (e.g. 210, FIG. 2) to the first buffer after Page 2 is moved out of the first buffer to the second buffer (Step 310). As used in FIG. 4A, "-2" in "330-2" indicates that the second memory unit is used with Step 330. Similarly, "-2" in "340-2" indicates that the second memory unit is used with Step 340.

Thus, the ECC logic is applied on data of Page 2 (Step 330-2), and data and corresponding ECCs for Page 3 are moved from the memory array to the first buffer (Step 310), within the same first time period T1 as when data of Page 1 is moved from the first memory unit in the third buffer to the data path. Accordingly, the read throughput of the memory device is improved by not requiring extra time for those read operations for Page 2 and Page 3.

During the second time period T2 subsequent to T1 in FIG. 4A, different time-overlapping read operations can be executed on data of three data pages. Data of Page 2 is moved from the second memory unit (e.g. 242, FIG. 2) in the third buffer to the data path (e.g. 270, FIG. 2), followed by the wait time, TW, for outputting the next data page (Step 350). Data of Page 3 is moved from the first buffer (e.g. 220, FIG. 2) to the second buffer (e.g. 230, FIG. 2) (Step 320). The ECC logic is then applied on data of Page 3 for error detection in the second buffer using corresponding ECCs while data of Page 3 is moved from the second buffer to the first memory unit (e.g. 241, FIG. 2) in the third buffer (Step 330). After Step 330, data of Page 3 is in the first memory unit, and the ECC logic has information from error detection for error correction. The ECC logic can then be applied for error correction on data of Page 3 in the first memory unit before the data is moved out of the third buffer (Step 340). Data and corresponding ECCs for a fourth page, Page 4, are moved from the memory array (e.g. 210, FIG. 2) to the first buffer after data of Page 3 is moved out of the first buffer to the second buffer (Step 310). As used in FIG. 4A, "-1" in "330-1" indicates that the first memory unit is used with Step 330. Similarly, "-1" in "340-1" indicates that the first memory unit is used with Step 340.

Thus, the ECC logic is applied on data of Page 3 (Step 330-1), and data and corresponding ECCs for Page 4 are moved from the memory array to the first buffer (Step 310), within the same first time period T2 as when data of Page 2 is moved from the second memory unit in the third buffer to the data path. Accordingly, the read throughput of the memory device is improved by not requiring extra time for those read operations for Page 3 and Page 4.

During an initial time period T0 prior to the first time period T1 in FIG. 4A, data and corresponding ECCs for the first page, Page 1, are moved from the memory array to the first buffer (Step 310). The data of Page 1 is then moved from the first buffer to the second buffer (Step 320). The ECC logic is then applied on data of Page 1 for error detection in the second buffer using corresponding ECCs while data of Page 1 is moved from the second buffer to the first memory unit (e.g. 241, FIG. 2) in the third buffer (Step 330). After Step 330, data of Page 1 is in the first memory unit, and the ECC logic has information from error detection for error correction. The ECC logic can then be applied for error correction on data of Page 1 in the first memory unit before the data is moved out of the third buffer (Step 340). Data and corresponding ECCs for the second page, Page 2, are moved from the memory array to the first buffer after Page 1 is moved out of the first buffer to the second buffer (Step 310).

For example, the initial time period T0 can be from about 45 μs (microseconds) to about 70 μs. The time to output a data page (e.g. Page 1 during T1 or Page 2 during T2) depends on an output clock frequency and the number of bytes in the data page. For instance, if the output clock has a period of 25 ns (nanoseconds) and there are 2,048 bytes in the data page, then the time to output the data page is about 50 μs (=25 ns×2,048) at a rate of one byte per output clock period, or about 25 μs (=25 ns×2,048/2) at a rate of two bytes per output clock period. The time to read a data page (e.g. Page 3 during T1) from the memory array to the first buffer can be about 20 μs. The time to move a data page (e.g. Page 2 during T1 at Step 320) from first buffer (e.g. 220, FIG. 2) to the second buffer (e.g. 230, FIG. 2) can be about 3 μs. The time to apply the ECC logic on a data page for error detection and error correction can range from about 20 μs to about 45 μs.

In general, the time to read data for a data page (e.g. Page 3) from the memory array (Step 310) is about constant for every data page. The time to apply the ECC logic for error detection and error correction on another data page (e.g. Page 2) (Steps 330 and 340) can vary depending on the number of failed bits in the data page on which the ECC logic is applied (e.g. Page 2). The first time period T1 is the longer of the time to read data (Step 310) and the time to apply the ECC logic for error detection and correction (Steps 330 and 340).

FIG. 4B is an example timing diagram illustrating alternative read operations associated with the first embodiment with ECC enabled. Description about FIG. 4A is generally applicable to FIG. 4B. The difference is that in FIG. 4A, the ECC logic is applied for error correction to data of pages before the data is moved out of the third buffer, while in FIG. 4B, the ECC logic is applied for error correction to data of pages while the data is moved from one of the first memory unit and the second memory unit in the third buffer to the data path. Read operations in the timing diagram correspond to Steps 310, 320, 330 and 360 illustrated in the flowchart in FIG. 3.

During the first time period T1 in FIG. 4B, the ECC logic is applied for error correction on data of Page 1 in the first memory unit (e.g. 241, FIG. 2) in the third buffer while the data is moved from the first memory unit to the data path (e.g. 270, FIG. 2), followed by a wait time, TW, for outputting the next data page (Step 360). Data of a second page, Page 2, is moved from first buffer (e.g. 220, FIG. 2) to the second buffer (e.g. 230, FIG. 2) (Step 320). The ECC logic is then applied on data of Page 2 for error detection in the second buffer using corresponding ECCs while data of Page 2 is moved from the second buffer to the second memory unit (e.g. 242, FIG. 2) in the third buffer. (Step 330). After Step 330, data of Page 2 is in the second memory unit, and the ECC logic has information from error detection for error correction. Data and corresponding ECCs for a third page, Page 3, are moved from the memory array (e.g. 210, FIG. 2) to the first buffer after Page 2 is moved out of the first buffer to the second buffer (Step 310). As used in FIG. 4B, "-2" in "330-2" indicates that the second memory unit is used with Step 330.

During the second time period T2 subsequent to T1 in FIG. 4B, the ECC logic is applied for error correction on data of Page 2 in the second memory unit (e.g. the second memory unit 242, FIG. 2) in the third buffer while the data is moved from the second memory unit to the data path (e.g. 270, FIG. 2), followed by the wait time, TW, for outputting the next data page (Step 360). Data of Page 3 is moved from first buffer (e.g. 220, FIG. 2) to the second buffer (e.g. 230, FIG. 2) (Step 320). The ECC logic is then applied on data of Page 3 for error detection in the second buffer using corresponding ECCs while data of Page 3 is moved from the second buffer to the first memory unit (e.g. 241, FIG. 2) in the third buffer (Step 330). After Step 330, data of Page 3 is in the first memory unit, and the ECC logic has information from error detection for error correction. Data and corresponding ECCs for a fourth page, Page 4, are moved from the memory array (e.g. 210, FIG. 2) to the first buffer after data of Page 3 is moved out of the first buffer to the second buffer (Step 310). As used in FIG. 4B, "-1" in "330-1" indicates that the first memory unit is used with Step 330.

During an initial time period T0 prior to the first time period T1 in FIG. 4B, data and corresponding ECCs for the first page, Page 1, are moved from the memory array to the first buffer (Step 310). The data of Page 1 is then moved from the first buffer to the second buffer (Step 320). The ECC logic is then applied on data of Page 1 for error detection in the second buffer using corresponding ECCs while data of Page 1 is moved from the second buffer to the first memory unit (e.g. 241, FIG. 2) in the third buffer (Step 330). After Step 330, data of Page 1 is in the first memory unit, and the ECC logic has information from error detection for error correction. Data and corresponding ECCs for the second page, Page 2, are moved from the memory array to the first buffer after Page 1 is moved out of the first buffer to the second buffer (Step 310).

Figure 4C:
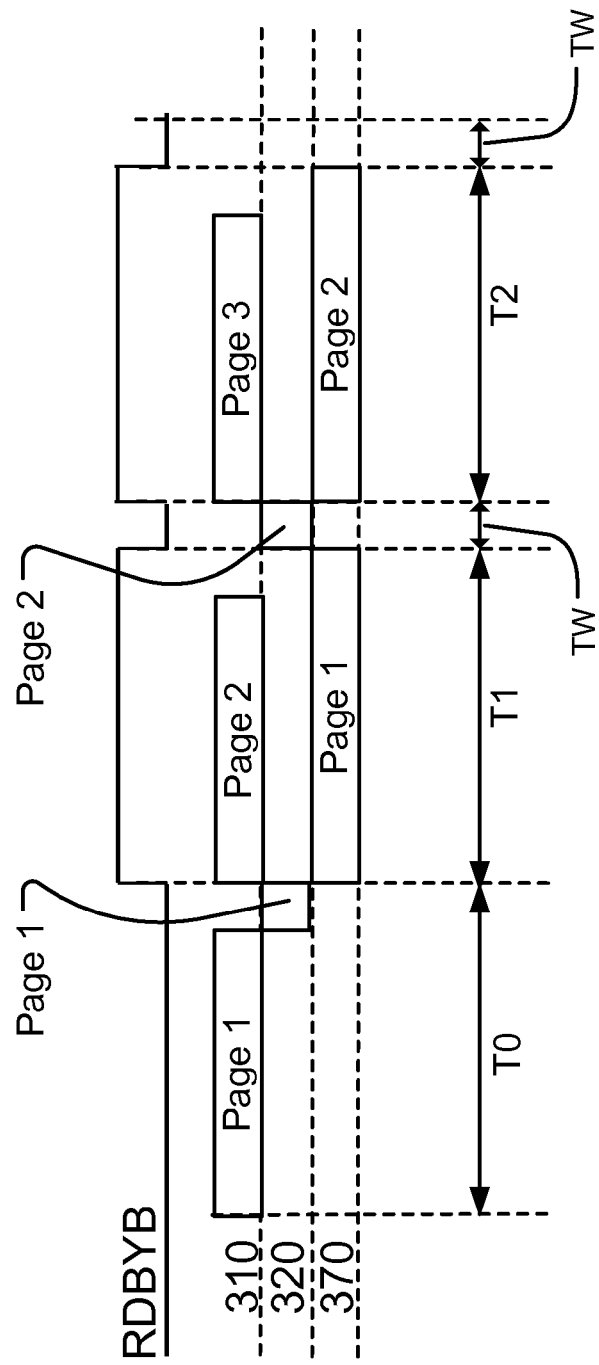
FIG. 4C is an example timing diagram illustrating read operations associated with the first embodiment with ECC disabled.

FIG. 4C is an example timing diagram illustrating read operations associated with the first embodiment with ECC disabled. The timing diagram illustrates read operations for multiple data pages during a first time period T1. The first time period T1 is repeatable for reading more data pages. For instance, a second time period T2 repeats read operations in T1 for subsequent data pages. The timing diagram also illustrates read operations during an initial time period T0 prior to the first time period. Signal RDBYB indicates whether the memory device 200 is ready to output data to a data path (e.g. 270 in FIG. 2). Read operations in the timing diagram correspond to Steps 310-340 illustrated in the flowchart in FIG. 3.

During an initial time period T0 prior to the first time period T1 in FIG. 4C, data of a first page, Page 1, is moved from the memory array to the first buffer (Step 310). Data of Page 1 is then moved from the first buffer to the second buffer (Step 320).

During the first time period T1 in FIG. 4C, data of Page 1 is moved from the second buffer (e.g. 230, FIG. 2) to the data path (e.g. 270, FIG. 2), followed by a wait time, TW, for outputting the next data page (Step 370). Data of a second page, Page 2, is moved from the memory array to the first buffer (Step 310), and then from the first buffer (e.g. 220, FIG. 2) to the second buffer (e.g. 230, FIG. 2) (Step 320). In the second time period T2, data of a third page, Page 3, is moved from the memory array (e.g. 210, FIG. 2) to the first buffer after Page 2 is moved from the first buffer to the second buffer (Step 310).

The control logic includes logic to move data of a sequence of pages to the memory array in a write mode. In the write mode, using time-overlapping operations, data of the first page is moved out of the first buffer to the memory array with the ECCs (e.g. 220 in FIG. 2), data of a second page is moved from the data path (e.g. 270 in FIG. 2) to the third buffer (e.g. 240 in FIG. 2), then data of the second page is moved from the third buffer to the second buffer (e.g. 230 in FIG. 2) with ECCs computed by the ECC logic (e.g. 250 in FIG. 2), and then data of the second page is moved from the second buffer to the first buffer with the ECCs after data of the first page is moved out of the first buffer to the memory array with the ECCs. The ECC logic is applied to compute an ECC for data of pages in the sequence before the data is moved out of the second buffer.

Figure 5:
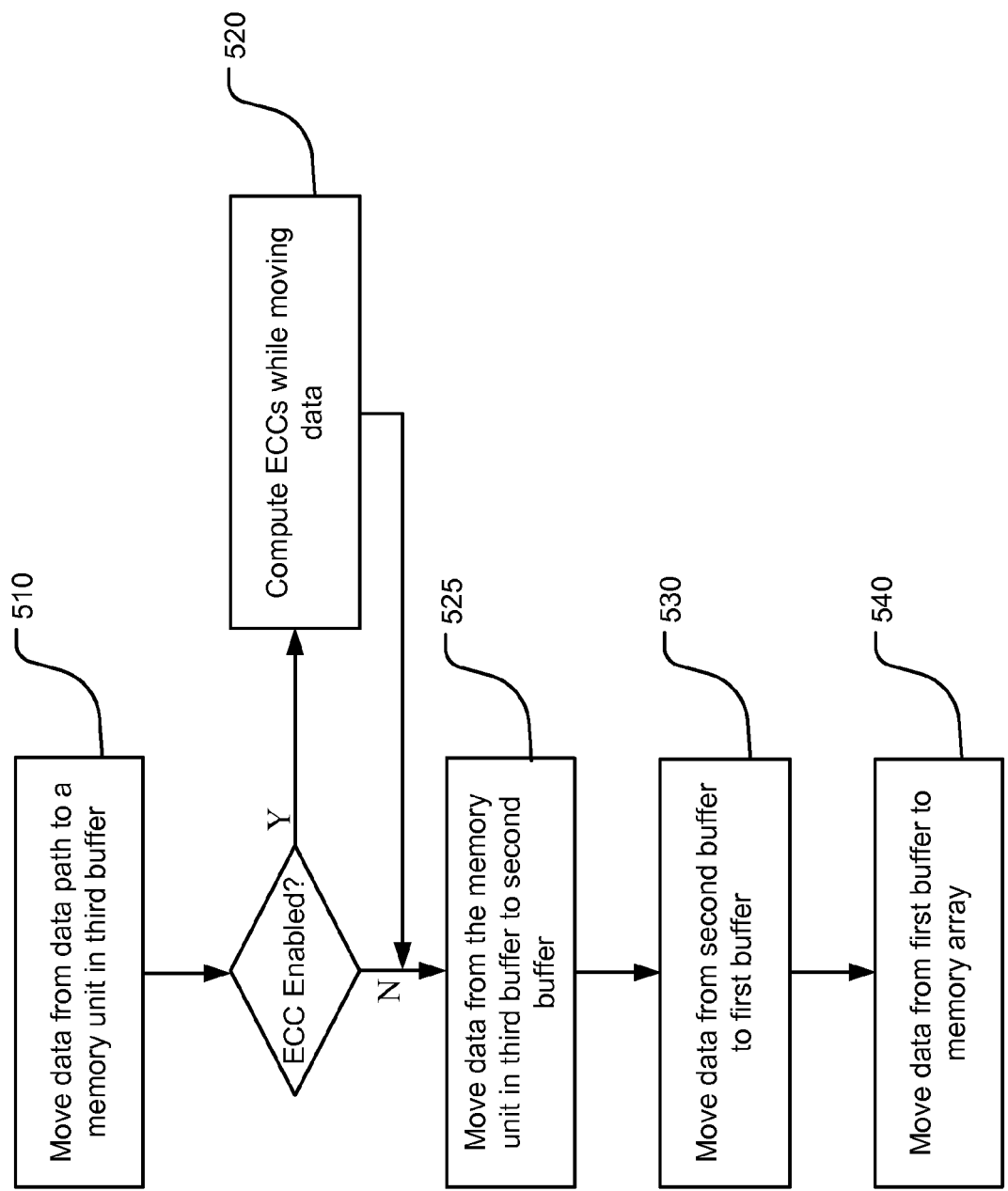
FIG. 5 is an example flowchart illustrating write operations associated with the first embodiment.

FIG. 5 is an example flowchart illustrating write operations associated with the first embodiment. Data is moved from the data path (e.g. 270 in FIG. 2) to the first memory unit (e.g. 241, FIG. 2) or the second memory unit (e.g. 242, FIG. 2) in the third buffer (e.g. 240 in FIG. 2) (Step 510).

If the ECC logic is enabled, the data is then moved from the first memory unit or the second memory unit in the third buffer to the second buffer (e.g. 230 in FIG. 2) with ECCs computed by the ECC logic (Steps 520 and 525). The data is then moved from the second buffer to the first buffer (e.g. 220 in FIG. 2) with the ECCs (Step 530), and then moved from the first buffer to the memory array (e.g. 210 in FIG. 2) with the ECCs (Step 540). For the first embodiment, the ECC logic is applied to compute an ECC for the data while the data is moved from the data path to the first memory unit (e.g. 241, FIG. 2) or the second memory unit (e.g. 241, FIG. 2) in the third buffer.

If the ECC logic is not enabled, the data is then moved from the first memory unit or the second memory unit in the third buffer to the second buffer (Step 525), then from the second buffer to the first buffer (Step 530), and then moved from the first buffer to the memory array without ECCs (Step 540).

Figure 6:
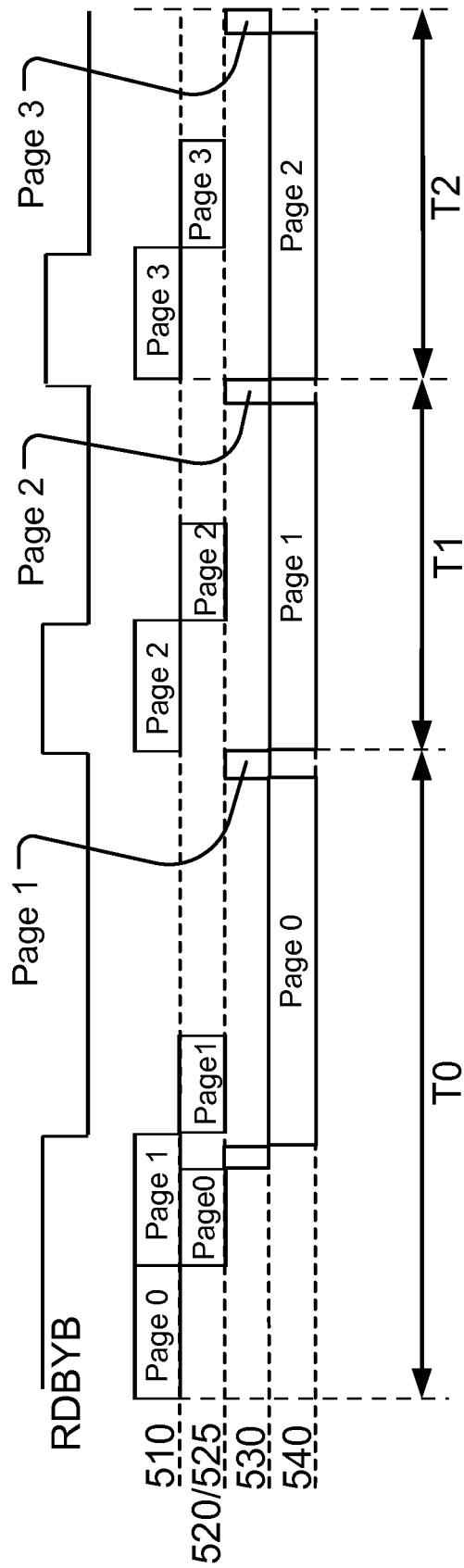
FIG. 6 is an example timing diagram illustrating write operations associated with the first embodiment with ECC enabled.

FIG. 6 is an example timing diagram illustrating write operations associated with the first embodiment with ECC enabled. Write operations in the timing diagram correspond to steps 510, 520, 530, and 540 illustrated in the flowchart in FIG. 5. The timing diagram illustrates write operations on multiple data pages during a first time period T1 and a second time period T2. The first time period T1 and second time period T2 are repeatable for writing more data pages. The first time period T1 and the second time period T2 alternately use the first memory unit (e.g. 241, FIG. 2) and the second memory unit (e.g. 242, FIG. 2) in the third buffer (e.g. 240, FIG. 2), as described below. The timing diagram also illustrates write operations during an initial time period T0 prior to the first time period. Signal RDBYB indicates whether the memory device 200 is ready to input data from the data path (e.g. 270, FIG. 2).

During the first time period T1 in FIG. 6, different time-overlapping write operations can be executed on two data pages. Data of a first page, Page 1, is moved out of the first buffer to the memory array with the ECCs (Step 540). Data of a second page, Page 2, is moved from the data path to the first memory unit in the third buffer (Step 510), then from the first memory unit in the third buffer to the second buffer with ECCs computed by the ECC logic (Steps 520 and 525), and then from the second buffer to the first buffer with the ECCs after data of Page 1 is moved out of the first buffer to the memory array (Step 530). The ECC logic is applied to compute an ECC for data of Page 2 while the data is moved from the first memory unit (e.g. 241, FIG. 2) in the third buffer to the second buffer (e.g. 230, FIG. 2). The ECCs computed by the ECC logic is stored in ECC buffer 235 as illustrated in FIG. 2.

Thus, data of Page 2 is moved from the data path to the first memory unit in the third buffer, and then to the second buffer with ECCs computed by the ECC logic, within the same first time period T1 as when data of Page 1 is moved to the memory array. Accordingly, ECC write operations on a data page (e.g. Page 2, FIG. 6) causes almost no timing impact on the write throughput of the memory device.

During the second time period T2 subsequent to T1 in FIG. 6, different time-overlapping write operations can be executed on two data pages. Data of Page 2 is moved out of the first buffer to the memory array with the ECCs (Step 540). Data of a third page, Page 3, is moved from the data path to the second memory unit in the third buffer (Step 510), then from the second memory unit in the third buffer to the second buffer with ECCs computed by the ECC logic (Steps 520 and 525), and then from the second buffer to the first buffer with the ECCs after data of Page 2 is moved out of the first buffer to the memory array (Step 530). The ECC logic is applied to compute an ECC for data of Page 3 while the data is moved from the second memory unit (e.g. 242, FIG. 2) in the third buffer to the second buffer (e.g. 230, FIG. 2). The ECCs computed by the ECC logic is stored in ECC buffer 235 as illustrated in FIG. 2.

Thus, data of Page 3 is moved from the data path to the second memory unit in the third buffer, and then to the second buffer with the ECCs computed by the ECC logic, within the same time period T2 as when data of Page 2 is moved to the memory array. Accordingly, ECC write operations on a data page (e.g. Page 3, FIG. 6) causes almost no timing impact on the write throughput of the memory device.

During an initial time period T0 prior to the first time period T1 in FIG. 6, data of an initial page, Page 0, is moved from the data path (e.g. 270, FIG. 2) to the first memory unit (e.g. 241, FIG. 2) in the third buffer, then from the first memory unit in the third buffer to the second buffer (e.g. 230 in FIG. 2) with ECCs computed by the ECC logic (e.g. 250 in FIG. 2), and then from the second buffer to the first buffer (e.g. 220 in FIG. 2) with the ECCs, and then data of Page 0 is moved out of the first buffer to the memory array with the ECCs.

During the same initial time period T0, after data of the initial page, Page 0, is moved to the first memory unit, data of the first page, Page 1, is moved from the data path to the second memory unit (e.g. 242, FIG. 2) in the third buffer, then from the second memory unit in the third buffer to the second buffer with ECCs computed by the ECC logic, and then from the second buffer to the first buffer with the ECCs after data of Page 0 is moved out of the first buffer to the memory array.

Figure 7:
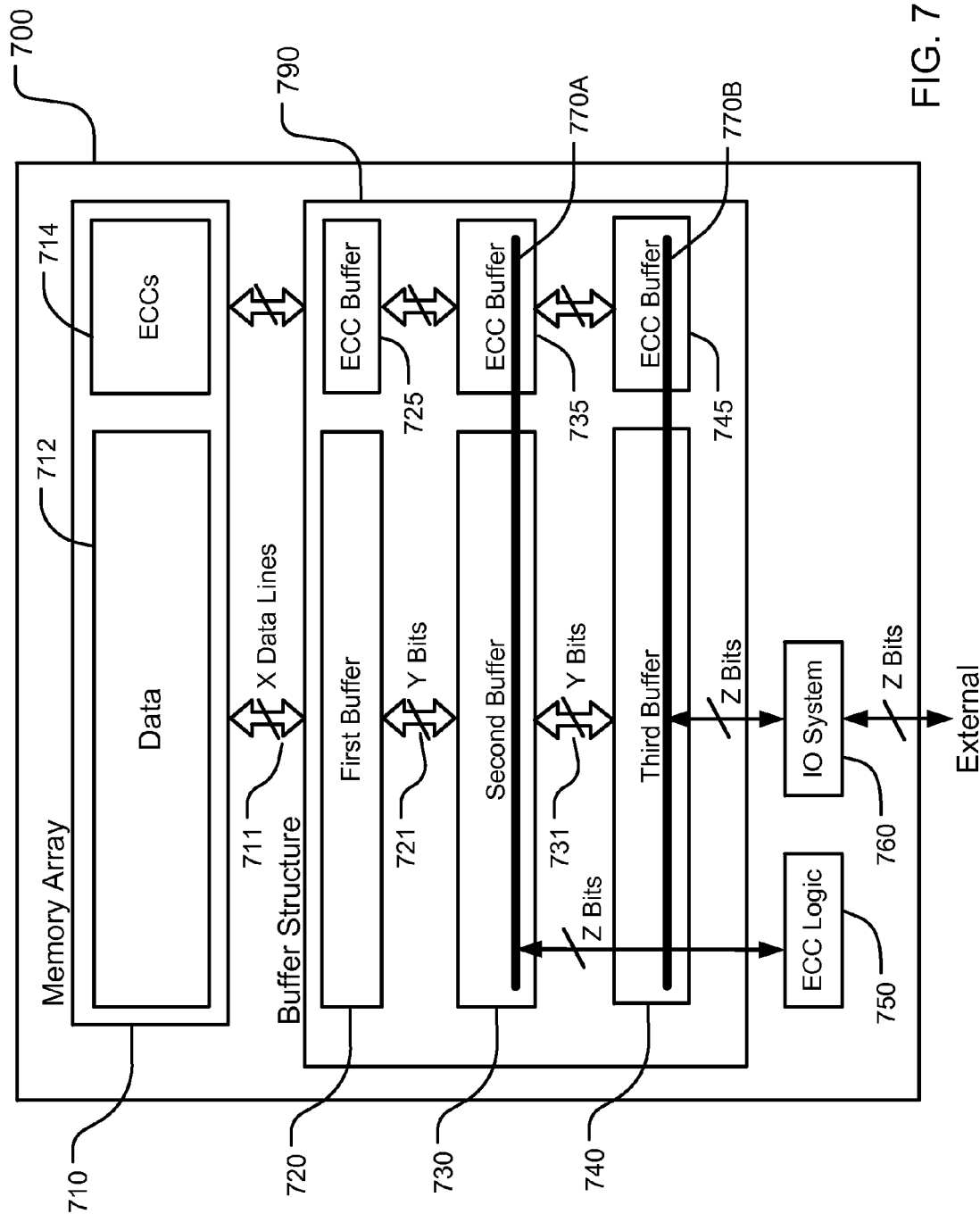
FIG. 7 is a simplified block diagram of a second embodiment of a memory device using built-in error correcting ECC logic.

FIG. 7 is a simplified block diagram of a second embodiment of a memory device 700 using built-in error correcting ECC logic. The device 700 includes a memory array 710 storing data 712 and error correcting codes ECCs 714 corresponding to the data, an input/output data path, and a multi-level buffer structure 790 between the memory array and the input/output data path. The memory array includes a plurality of data lines 711 for page mode operations. The multi-level buffer structure 290 includes a first buffer 720 having storage cells connected to respective data lines in the plurality of data lines for a page of data, a second buffer 730 coupled to the storage cells in the first buffer for storing at least one page of data, and a third buffer 740 coupled to the second buffer and to the input/output data path. The device 700 includes logic coupled to the multi-level buffer to perform a logical process over pages of data during movement between the memory array and the input/output path through the multi-level buffer for at least one of page read and page write operations.

In this example, the data path includes a first data path 770A and a second data path 770B. The first data path 770A couples the ECC logic 750 to the second buffer 730 with a width of Z bits. The second data path 770B couples an input/output system 760 to the third buffer 740 with a width of Z bits, where Z can be 8 or 16 for example. In read and write operations, data is moved between the third buffer 740 and the input/output system 760 via the second data path 770B.

The device 700 includes an interface between the first buffer 720 and the second buffer 730 that provides for movement of a page of data between the first and second buffers in one read or write cycle. The device 700 also includes an interface between the second buffer 730 and the third buffer 740 that provides for movement of a page of data between the second and third buffers in one read or write cycle. The second buffer 730 stores error correcting codes ECCs for corresponding data in ECC buffer 735.

The device includes ECC logic to detect and correct errors in the data using the corresponding ECCs. The device includes a controller (e.g. Control Logic in FIG. 14) coupled to the multi-level buffer structure 790, the ECC logic 750 and the memory array 710. The ECC logic can include logic to move data of a sequence of pages from the memory array, including logic for time-overlapping operations to move error corrected data of a first page from the third buffer 740 to the second data path 770B, to move data of a second page from the second buffer 730 to the third buffer 740, to move data of a third page from the first buffer 720 to the second buffer 730, and to apply the ECC logic 750 for error detection to data of pages in the sequence before the data is moved out of the second buffer 730.

The ECC logic 750 can include logic to move data of a sequence of pages to the memory array, including logic for time-overlapping operations to move data of a second page from the second data path 770B to the third buffer 740, to move data of the second page from the third buffer 740 to the second buffer 730 with ECCs computed by the ECC logic 750, to move data of a first page out of the first buffer 720 to the memory array 710 with the ECCs, to move data of the second page from the second buffer 730 to the first buffer 720, and to apply the ECC logic to compute an ECC for data of pages in the sequence before the data is moved out of the second buffer 730.

Error correcting codes ECCs for corresponding data in the second buffer 730 are stored in ECC buffer 735. Error correcting codes ECCs for corresponding data in the third buffer 740 are stored in ECC buffer 745. The third buffer 740 has a width equal to or matching a width of the second buffer 730. For instance, the second buffer 730 and the third buffer 740 can both have a width of 2048 bits. The second buffer 730 and the third buffer 740 can be placed in close proximity in the buffer structure 790 to achieve compact silicon area and faster transmission time between the two buffers.

A first data bus 711 with X data lines coupling the first buffer 720 to the memory array 710 has a first data bus width equal to or greater than a second data bus width of Y bits of a second data bus 721 coupling the second buffer 730 to the first buffer 720, where the second data bus width is greater than a width of the first data path 770A or the second data path 770B.

The third buffer 740 is coupled to the second buffer 730 via a third data bus 731, and coupled to the second data path 770B. The third data bus 731 has a data bus width of Y bits greater than a width of Z bits of the second data path 770B. For instance, the third data bus 731 can have a data bus width of 2048 bits, while the second data path 770B can have a width of 8 or 16 bits. Both the second buffer 730 and the third buffer 740 can be implemented with a cache memory that has a one row by multiple column architecture. For instance, both the second buffer 730 and the third buffer 740 can have one row with 2048 columns or a width of 2048 bits. Multi-level cache arrangement including the second buffer 730 and the third buffer 740 for example can be utilized for procedures requiring operations on data moving into and out of the memory array 710, such as in support of ECC operations.

FIG. 7 illustrates an alternative arrangement of the second and third buffers of the buffer structure available to the peripheral circuitry that can be effectively utilized for the ECC operations described herein. In the illustrated example, the second buffer 730 of the buffer structure 790 can be implemented physically adjacent the first buffer 720 for example. Also, in the illustrated example, the third buffer 740 of the buffer structure 790 can be implemented physically adjacent the second buffer 730 for example.

Figure 8:
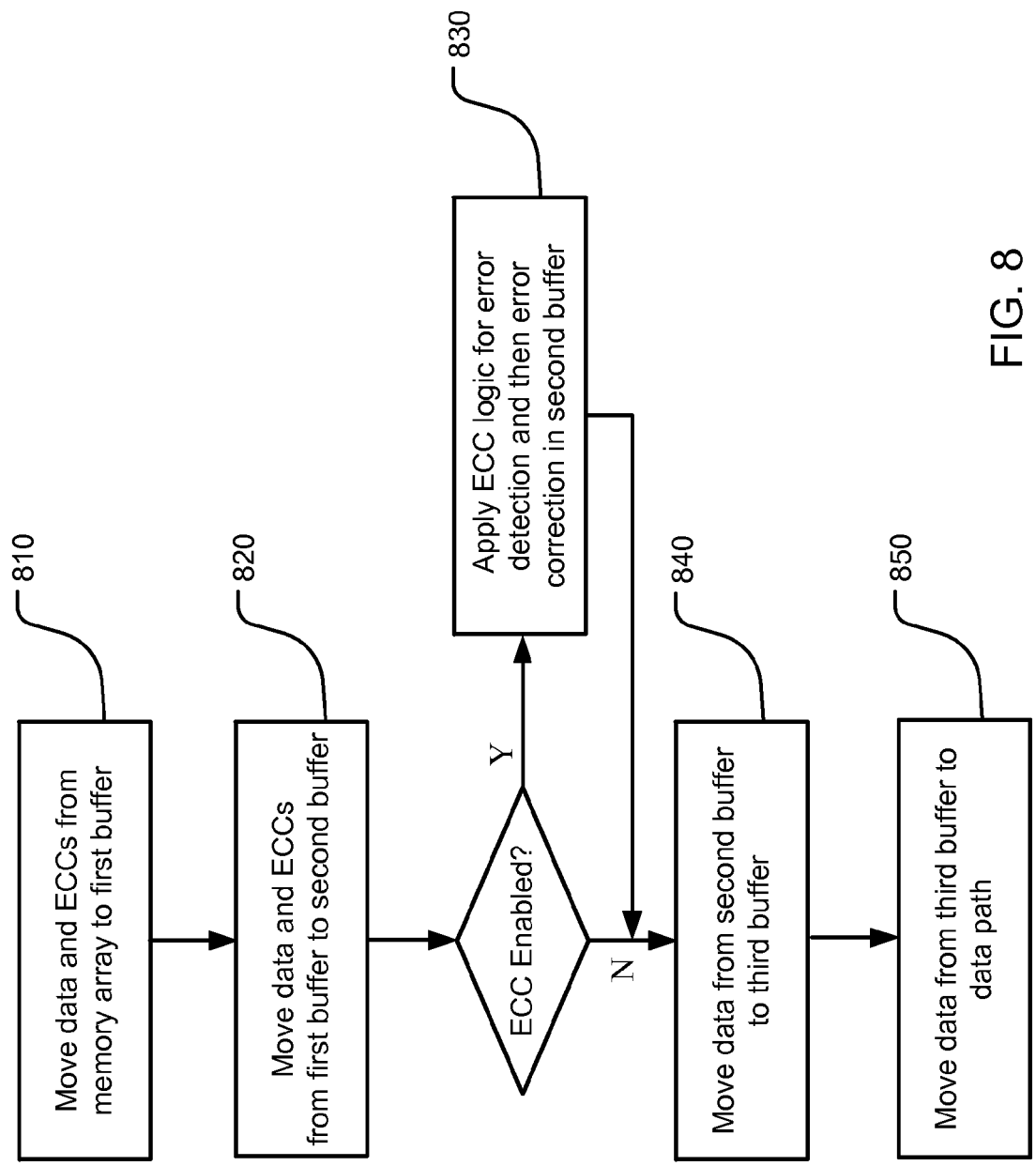
FIG. 8 is an example flowchart illustrating read operations associated with the second embodiment.

FIG. 8 is an example flowchart illustrating read operations of the second embodiment. Data and corresponding ECCs of a data page are moved from the memory array (e.g. 710, FIG. 7) to the first buffer (e.g. 720) and the ECC buffer (e.g. 725, FIG. 7), respectively (Step 810). The data and the ECCs of the data page are then moved from the first buffer and ECC buffer (e.g. 720 and 725, FIG. 7) to the second buffer (e.g. 730, FIG. 7) before error correction using the ECCs, where the ECCs are stored in the ECC buffer (e.g. 735, FIG. 7) associated with the second buffer (Step 820).

If the ECC logic is enabled, the ECC logic 750 is applied on the data for error detection and then error correction, using corresponding ECCs (Step 830), before the data is moved out of the second buffer. Corrected data of the data page is then moved from the second buffer (e.g. 730, FIG. 7) to the third buffer (e.g. 740, FIG. 7) (Step 840). Corrected data of the data page is then moved from the third buffer to the data path (e.g. 770B, FIG. 7) (Step 850). If the ECC logic is not enabled, data of the data page is moved from the second buffer to the third buffer (Step 840), and then to the data path without error correction (Step 850).

Figure 9:
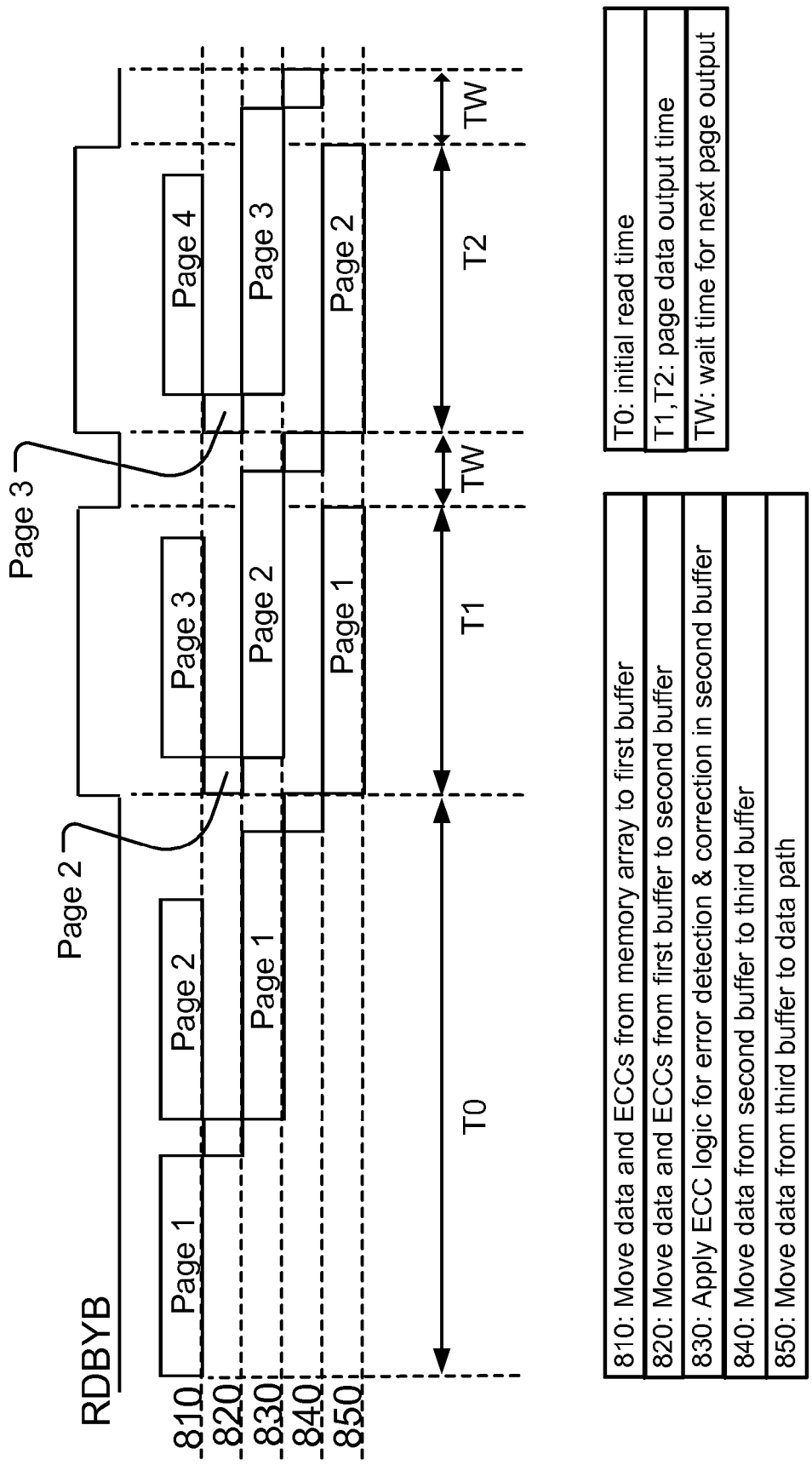
FIG. 9 is an example timing diagram illustrating read operations associated with the second embodiment with ECC enabled.

FIG. 9 is an example timing diagram illustrating read operations associated with the second embodiment with ECC enabled. The timing diagram illustrates read operations for multiple data pages during a first time period T1. The first time period T1 is repeatable for reading more data pages. As an example, a second time period T2 repeats read operations in the time period T1 for more data pages. The timing diagram also illustrates read operations during an initial time period T0 prior to the first time period. Signal RDBYB indicates whether the memory device 700 is ready to output data to a data path (e.g. 770B in FIG. 7). Read operations in the timing diagram correspond to Steps 810-850 illustrated in the flowchart in FIG. 8.

During the first time period T1 in FIG. 9, different read operations can be executed on three data pages. Data of a first page, Page 1, is moved from the third buffer (e.g. 740, FIG. 7) to the data path (e.g. 770B, FIG. 7), followed by a wait time, TW, for outputting the next data page (Step 850). Data of a second page, Page 2, is moved from first buffer (e.g. 720, FIG. 7) to the second buffer (e.g. 730, FIG. 7) (Step 820). The ECC logic is applied on the data of Page 2 for error detection and then error correction using corresponding ECCs (Step 830). Data of Page 2 is then moved from the second buffer to the third buffer, where the third buffer becomes available for Page 2 during the wait time TW after Page 1 is moved from the third buffer to the data path (Step 840). Data and corresponding ECCs for a third page, Page 3, are moved from the memory array (e.g. 710, FIG. 7) to the first buffer after Page 2 is moved from the first buffer to the second buffer (Step 810).

Thus, the ECC logic is applied on data of Page 2 (Step 830), and data and corresponding ECCs for Page 3 are moved from the memory array to the first buffer (Step 810), within the same first time period T1 as when data of Page 1 is moved from the third buffer to the data path. Accordingly, the read throughput of the memory device is improved by not requiring extra time for those read operations for Page 2 and Page 3.

During an initial time period T0 prior to the first time period T1, data and corresponding ECCs for Page 1 are moved from the memory array to the first buffer (Step 810), and then from the first buffer to the second buffer (Step 820). The ECC logic is applied on the data of Page 1 for error detection and then error correction using corresponding ECCs (Step 830). Data of Page 1 is then moved from the second buffer to the third buffer (Step 840).

During the same initial time period T0, data and corresponding ECCs for Page 2 are moved from the memory array to the first buffer after Page 1 is moved from the first buffer to the second buffer (Step 810).

Figure 10:
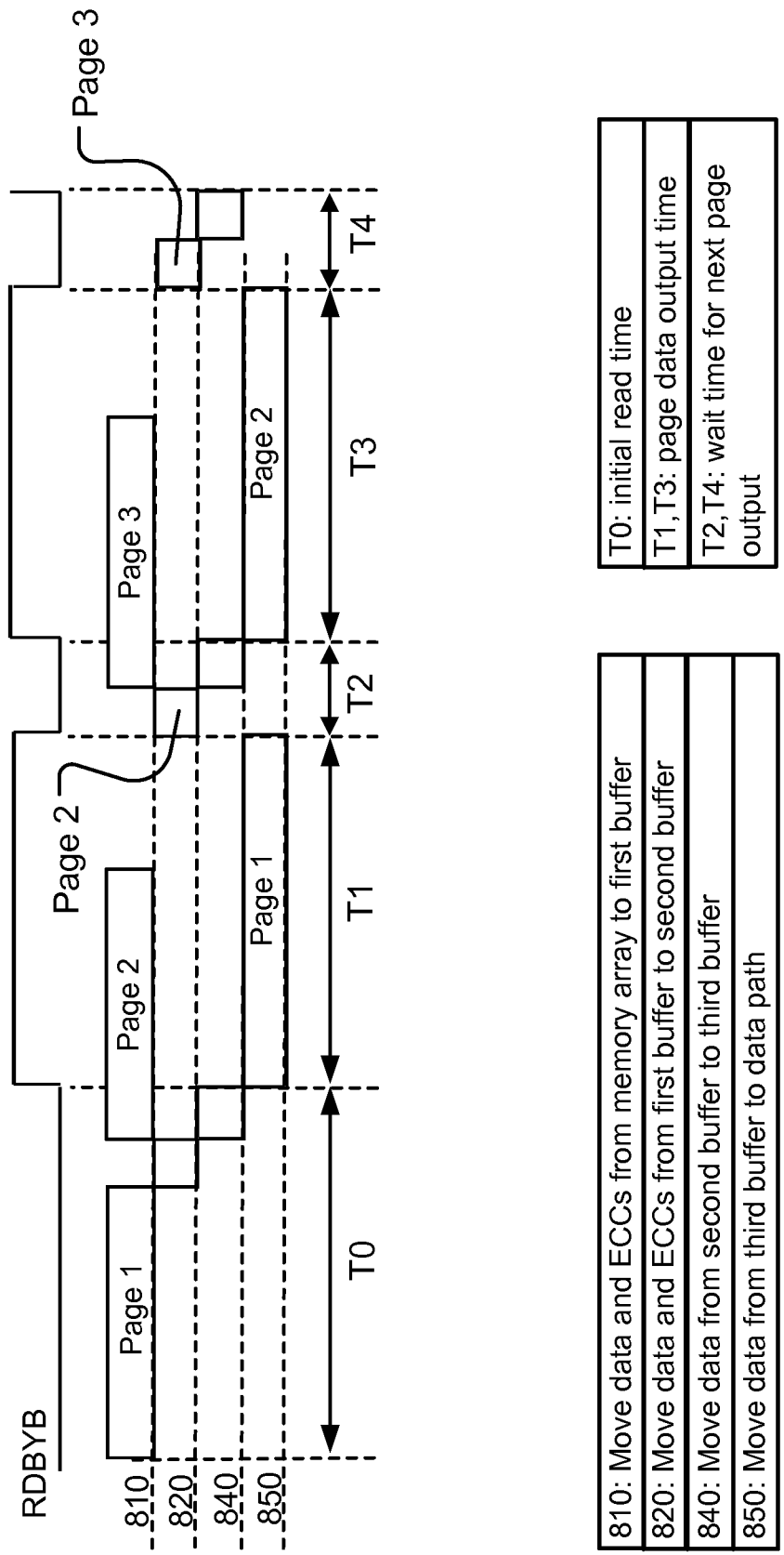
FIG. 10 is an example timing diagram illustrating read operations associated with the second embodiment with ECC disabled.

FIG. 10 is an example timing diagram illustrating read operations associated with the second embodiment when ECC is disabled. The timing diagram illustrates read operations for multiple data pages during a first time period T1 and a second time period T2. The first time period T1 and second time period T2 are repeatable for reading more data pages. As an example, a time period T3 and a time period T4 repeat read operations in the time periods T1 and T2 for more data pages. The timing diagram also illustrates read operations during an initial time period T0 prior to the first time period. Signal RDBYB indicates whether the memory device 700 is ready to output data to a data path (e.g. 770B in FIG. 7). Read operations in the timing diagram correspond to Steps 810, 820, 840 and 850 illustrated in the flowchart in FIG. 8. Step 830 in the flowchart in FIG. 8 is bypassed because ECC is disabled.

During the first time period T1, data of a first page, Page 1, is moved from the third buffer (e.g. 740, FIG. 7) to the data path (e.g. 770B in FIG. 7) (Step 850), and data of a second page, Page 2, is moved from the memory array to the first buffer (e.g. 720, FIG. 7) (Step 810).

During a second time period T2 subsequent to the first time period T1, Page 2 is moved from the first buffer to the second buffer (Step 820) and then from the second buffer to the third buffer (Step 840), and data of a third page, Page 3, is moved from the memory array to the first buffer after Page 2 is moved from the first buffer to the second buffer (Step 810).

During an initial time period T0 prior to the first time period T1, data of the first page, Page 1, is moved from the memory array to the first buffer (Step 810), then from the first buffer to the second buffer (Step 820), and then from the second buffer to the third buffer (Step 840). Data of the second page, Page 2, is moved from the memory array to the first buffer after Page 1 is moved from the first buffer to the second buffer after Page 1 is moved from the first buffer to the second buffer (Step 810).

Figure 11:
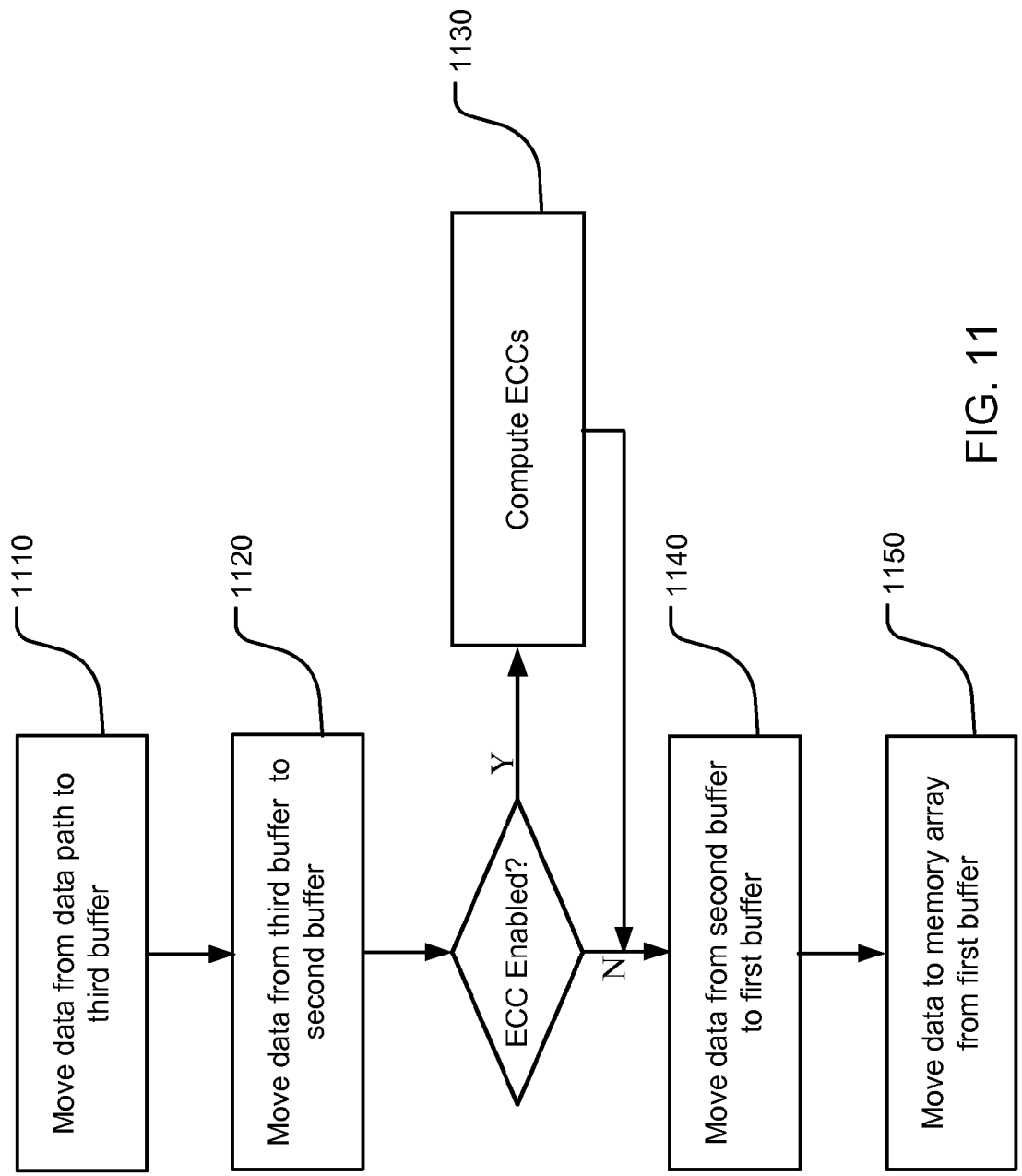
FIG. 11 is an example flowchart illustrating write operations associated with the second embodiment.

FIG. 11 is an example flowchart illustrating write operations associated with the second embodiment. Data is moved from the data path (e.g. 770B in FIG. 7) to the third buffer (e.g. 740 in FIG. 7) without ECCs (Step 1110).

If the ECC logic is enabled, the data is moved from the third buffer to the second buffer (e.g. 730 in FIG. 7) with ECCs computed by the ECC logic (Steps 1120 and 1130). The data is moved from the second buffer to the first buffer (e.g. 720 in FIG. 7) with the ECCs (Step 1140), and then moved from the first buffer to the memory array (e.g. 710 in FIG. 7) with the ECCs (Step 1150). For the second embodiment, the ECC logic is applied to compute an ECC for the data while the data is moved from the third buffer (e.g. 740 in FIG. 7) to the second buffer (e.g. 730 in FIG. 7) and before the data is moved out of the second buffer.

If the ECC logic is not enabled, the data is moved from the third buffer to the second buffer (Step 1120), then from the second buffer to the first buffer (Step 1140), and then from the first buffer to the memory array (Step 1150).

Figure 12:
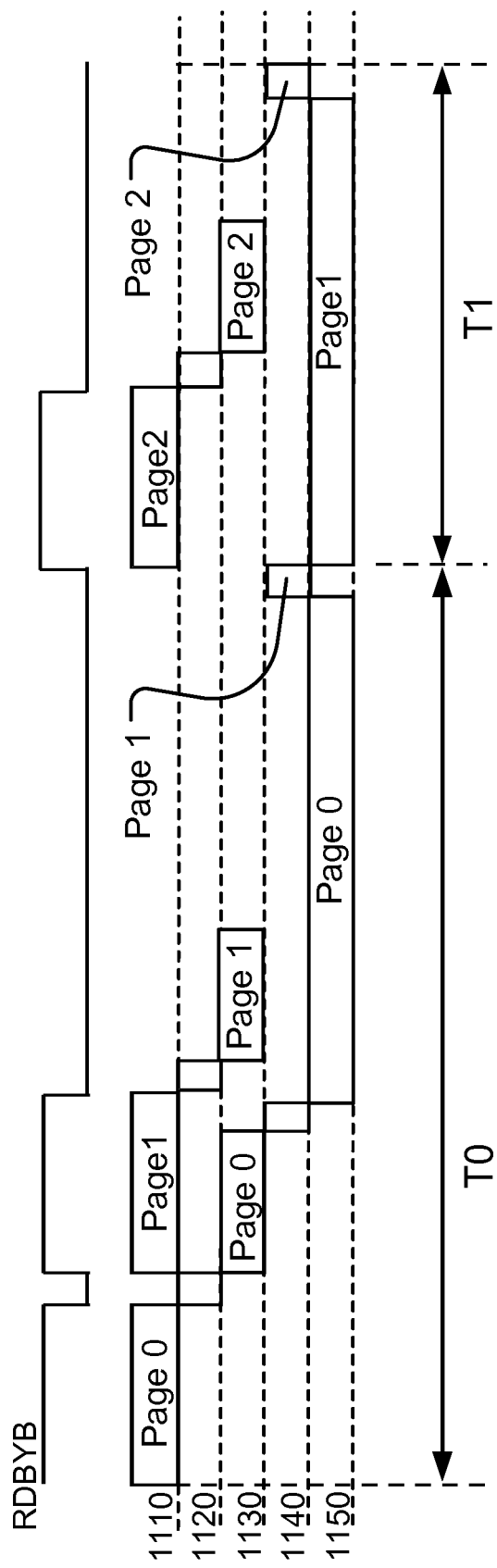
FIG. 12 is an example timing diagram illustrating write operations associated with the second embodiment with ECC enabled.

FIG. 12 is an example timing diagram illustrating write operations associated with the second embodiment with ECC enabled. Write operations in the timing diagram correspond to steps 1110-1150 illustrated in the flowchart in FIG. 11. The timing diagram illustrates write operations on multiple data pages during a first time period T1. The first time period T1 is repeatable for writing more data pages. The timing diagram also illustrates write operations during an initial time period T0 prior to the first time period. Signal RDBYB indicates whether the memory device 700 is ready to input data from the data path (e.g. 770B, FIG. 7).

During the first time period T1, the data of the first page, Page 1, is moved out of the first buffer to the memory array with the ECCs (Step 1150). Data of a second page, Page 2, is moved from the data path to the third buffer without ECCs (Step 1110) and then moved from the third buffer to the second buffer without ECCs (Step 1120). The ECC logic is applied to compute ECCs on data of Page 2 before the data is moved out of the second buffer (Step 1130). Data of Page 2 is then moved from the second buffer to the first buffer with the ECCs computed by the ECC logic after data of Page 1 is moved out of the first buffer to the memory array (Step 1140).

Thus, data of Page 2 is moved from the data path to the third buffer without ECCs, and then to the second buffer without ECCs, and the ECC logic is applied to compute ECCs on the data in the second buffer, within the same first time period T1 as when data of Page 1 is moved to the memory array. Accordingly, ECC write operations on a data page (e.g. Page 2, FIG. 12) causes almost no timing impact on the write throughput of the memory device.

During an initial time period T0 prior to the first time period T1, data of an initial page, Page 0, is moved from the data path to the third buffer without ECCs (Step 1110), then from the third buffer to the second buffer without (Step 1120). The ECC logic is applied to compute ECCs on data of Page 0 before the data is moved out of the second buffer (Step 1130). Data of Page 0 is then moved from the second buffer to the first buffer with the ECCs computed by the ECC logic (Step 1140). Data of Page 0 is then moved out of the first buffer to the memory array with the ECCs (Step 1150).

During the same initial time period T0, after data of Page 0 is moved from the third buffer to the second buffer, data of Page 1 is moved from the data path to the third buffer without ECCs (Step 1110), then from the third buffer to the second buffer without ECCs (Step 1120). The ECC logic is applied to compute ECCs on data of Page 1 before the data is moved out of the second buffer (Step 1130). Data of Page 1 is then moved from the second buffer to the first buffer with the ECCs computed by the ECC logic after data of Page 0 is moved out of the first buffer to the memory array (Step 1140).

Figure 13:
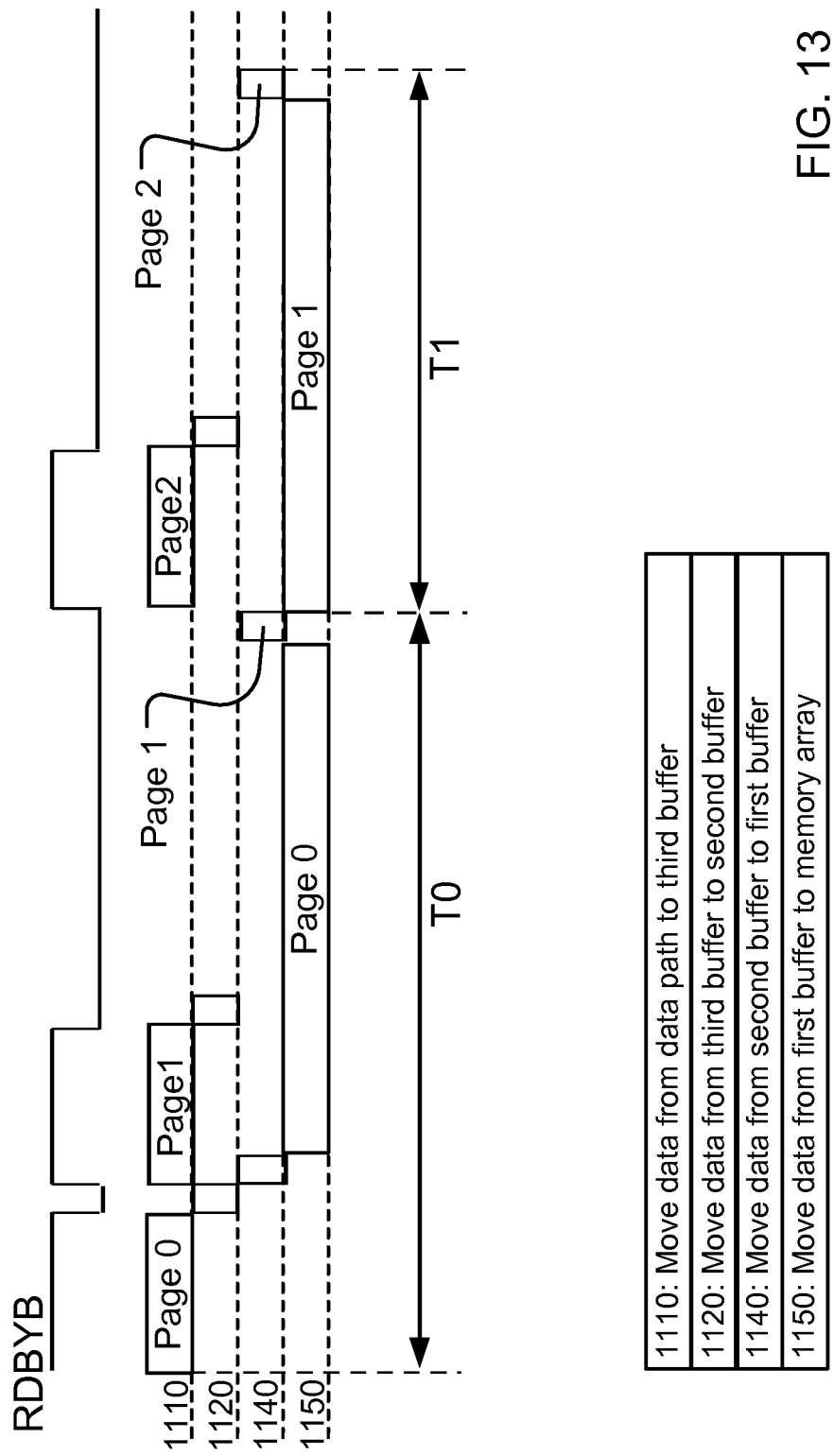
FIG. 13 is an example timing diagram illustrating write operations associated with the second embodiment with ECC disabled.

FIG. 13 is an example timing diagram illustrating write operations associated with the second embodiment when ECC is disabled. The timing diagram illustrates write operations on multiple data pages during a first time period T1. The first time period T1 is repeatable for writing more data pages. The timing diagram also illustrates write operations during an initial time period T0 prior to the first time period T1. Signal RDBYB indicates whether the memory device 700 is ready to input data from a data path (e.g. 770B in FIG. 7). Write operations in the timing diagram correspond to Steps 1110, 1120, 1140 and 1150 illustrated in the flowchart in FIG. 11. Step 1130 in the flowchart in FIG. 11 is bypassed because ECC is disabled.

During the first time period T1, data of Page 1 is moved out of the first buffer to the memory array (Step 1150), data of a second page, Page 2, is moved from the data path to the third buffer (Step 1110), then from the third buffer to the second buffer (Step 1120), and then from the second buffer to the first buffer after data of Page 1 is moved out of the first buffer to the memory array (Step 1140).

During an initial time period T0 prior to the first time period T1, data of an initial page, Page 0, is moved from the data path to the third buffer (Step 1110), then from the third buffer to the second buffer (Step 1120), and then from the second buffer to the first buffer (Step 1140), and then data of Page 0 is moved out of the first buffer to the memory array (Step 1150).

During the same initial time period T0, Page 1 is moved from the data path to the third buffer after Page 0 is moved from the third buffer to the second buffer (Step 1110), then Page 1 is moved from the third buffer to the second buffer (Step 1120), and then from the second buffer to the first buffer after data of Page 0 is moved out of the first buffer to the memory array (Step 1140).

Figure 14:
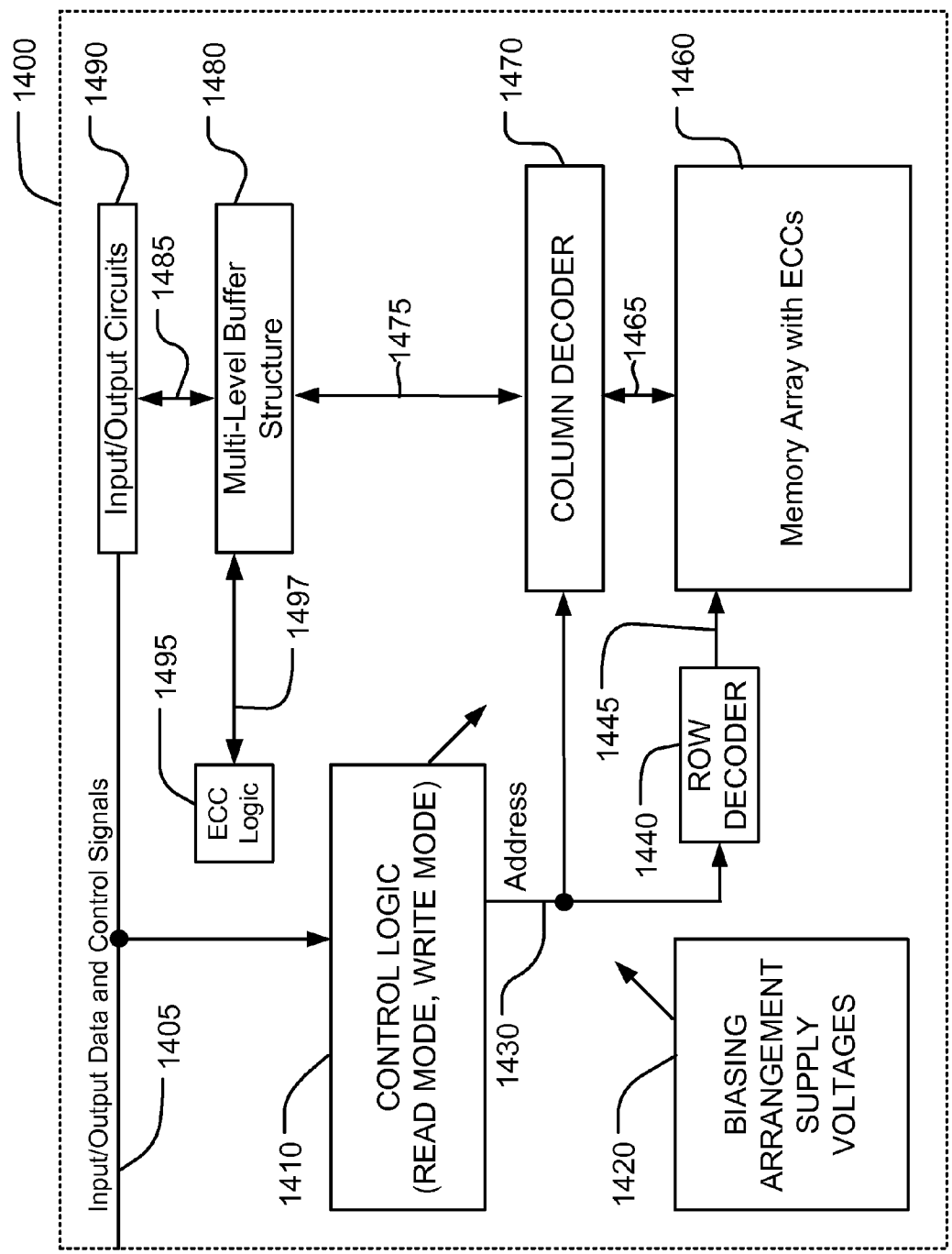
FIG. 14 is a simplified chip block diagram of an integrated circuit memory device.

FIG. 14 is a simplified chip block diagram of an integrated circuit memory device according to an embodiment. The integrated circuit 1400 includes a memory array 1460 that stores data with ECCs, on an integrated circuit substrate.

A row decoder 1440 is coupled to a plurality of word lines 1445, and arranged along rows in the memory array 1460. A column decoder 1470 is coupled to a plurality of bit lines 1465 arranged along columns in the memory array 1460 for reading data from and writing data to the memory array 1460. Addresses are supplied on bus 1430 from control logic 1410 to column decoder 1470, and row decoder 1440. A multi-level buffer structure 1480 is coupled to the column decoder 1470, in this example via a first data bus 1475, and coupled to input/output circuits 1490, in this example via a second data bus 1485. The input/output circuits 1490 are coupled to the input/output data path (e.g. 270 in FIG. 2, 770A and 770B in FIG. 7). The multi-level buffer structure 1480 includes a first buffer (e.g. 220 in FIG. 2, 720 in FIG. 7) including sense amplifiers for read operations and a program buffer for write operations. The multi-level buffer structure 1480 can include a second buffer (e.g. 230 in FIG. 2, 730 in FIG. 7) and a third buffer (e.g. 240 in FIG. 2, 740 in FIG. 7). Input/output circuits 1490 drive the data to destinations external to the integrated circuit 1400. Input/output data and control signals are moved via data bus 1405 between the input/output circuits 1490, the control logic 1410 and input/output ports on the integrated circuit 1400 or other data sources internal or external to the integrated circuit 1400, such as a general purpose processor or special purpose application circuitry, or a combination of modules providing system-on-a-chip functionality supported by the memory array 1460.

In the example shown in FIG. 14, control logic 1410 using a bias arrangement state machine controls the application of bias arrangement supply voltage generated or provided through the voltage supply or supplies in block 1420, such as read and program voltages. The control logic 1410 is coupled to the multi-level buffer structure 1480, the ECC logic 1495, and the memory array with ECCs 1460. The control logic 1410 includes logic to perform a logical process over pages of data during movement between the memory array and the input/output path through the multi-level buffer for at least one of page read and page write operations.

In the read mode, during a time period, error corrected data of a first page is moved from a third buffer to the data path, data of a second page is moved from the second buffer to the third buffer, and data of a third page is moved from the memory array to the second buffer. The ECC logic is applied for error detection to data of pages in the sequence before the data is moved out of the second buffer. In one embodiment, the ECC logic is applied for error correction to data of pages in the sequence before the data is moved out of the third buffer or while the data is moved from one of the first memory unit and the second memory unit to the data path. In another embodiment, the ECC logic is applied for error correction to data of pages in the sequence before the data is moved out of the second buffer.

In the write mode, during a time period, data of a first page is moved out of the first buffer to the memory array with the ECCs, data of a second page is moved from the data path to the third buffer, then data of the second page is moved from the third buffer to the second buffer with ECCs computed by ECC logic 1495, and then data of the second page is moved from the second buffer to the first buffer with the ECCs after data of the first page is moved out of the first buffer to the memory array. The ECC logic is applied to compute an ECC for data of pages in the sequence before the data is moved out of the second buffer.

The control logic 1410 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

Although the storage scheme disclosed is described for ECC operations, the storage scheme can be used for other page mode operations, such as data compression and decompression, to perform a logical process over pages of data during movement between the memory array and the input/output path through the multi-level buffer.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A device comprising:
a memory array storing data and error correcting codes ECCs corresponding to the data, the memory array including a plurality of data lines for page mode operations;
an input/output data path;
a multi-level buffer structure between the memory array and the input/output data path, wherein the buffer structure includes a first page buffer having storage cells connected to respective data lines in the plurality of data lines, a second page buffer connected through a first bidirectional data path to the storage cells in the first page buffer, and a third buffer connected through a second bidirectional data path to the second page buffer and to the input/output data path, the second page buffer and the third buffer including storage cells, the first page buffer and the second page buffer having respective widths of at least one page width;
control logic coupled to the multi-level buffer to perform a logical process over pages of data during movement between the memory array and the input/output path through the multi-level buffer for at least one of page read and page write operations,
wherein the third buffer comprises a first memory unit coupled to the second page buffer by a storage bus and a second memory unit coupled to the second page buffer by said storage bus or by a second storage bus, and including logic to move data from the second page buffer to one of the first memory unit and the second memory unit, while moving data from another of the first memory unit and the second memory unit to the input/output data path.

2. The device of claim 1, including an interface between the first page buffer and the second page buffer that provides for movement of a page of data between the storage cells in the first and second page buffers in one read or write cycle.

3. The device of claim 1, including an interface between the second page buffer and the third buffer that provides for movement of a page of data between the storage cells in the second and third buffers in one read or write cycle.

4. The device of claim 1, including ECC logic to detect and correct errors in the data using the corresponding ECCs; and said control logic includes a controller coupled to the multi-level buffer structure, and the ECC logic including logic to move data of a sequence of pages from the memory array, including logic for time-overlapping operations to move error corrected data of a first page from storage cells in the third buffer to the data path, to move data of a second page from storage cells in the second page buffer to storage cells in the third buffer, to move data of a third page from storage cells in the first page buffer to storage cells in the second page buffer, and to apply the ECC logic for error detection to data of pages in the sequence before the data is moved out of storage cells in the second page buffer.

5. The device of claim 4, wherein
the ECC logic is applied for error correction to data of pages in the sequence before the data is moved out of the third buffer or while the data is moved from one of the first memory unit and the second memory unit to the input/output data path.

6. The device of claim 4, the control logic further including, when the ECC logic is disabled:
logic to, during a first time period, move data of a first page from the third buffer to the data path, and move data of a second page from the memory array to the first page buffer; and
logic to, during a second time period subsequent to the first time period, move data of the second page from the first page buffer to the second page buffer and then from the second page buffer to the third buffer, and move data of a third page from the memory array to the first page buffer,
wherein said logic to move the data of the first page during the first time period and said logic to move the data of the second page during the second time period are repeatable for reading more data pages.

7. The device of claim 1, wherein the second page buffer stores error correcting codes ECCs for corresponding data.

8. The device of claim 1, including logic to move data from one of the first memory unit and the second memory unit to the second page buffer, while moving data from the input/output data path to another of the first memory unit and the second memory unit.

9. The device of claim 1, including ECC logic to compute ECCs for the data; and said control logic includes a controller coupled to the multi-level buffer structure, and the ECC logic including logic to move data of a sequence of pages to the memory array, including logic for time-overlapping operations to move data of a second page from the data path to the third buffer, to move data of the second page from the third buffer to the second page buffer with ECCs computed by the ECC logic, to move data of a first page out of the first page buffer to the memory array with the ECCs, to move data of the second page from the second page buffer to the first page buffer, and to apply the ECC logic to compute an ECC for data of pages in the sequence before the data is moved out of the second page buffer.

10. A method of operating a memory device, the memory device comprising a memory array storing data and error correcting codes ECCs corresponding to the data and including a plurality of data lines, a multi-level buffer structure between the memory array and an input/output data path, wherein the buffer structure includes a first page buffer having storage cells connected to respective data lines in the plurality of data lines for a page of data, a second page buffer connected through a first bidirectional data path to the storage cells in the first page buffer for storing at least one page of data, and a third buffer connected through a second bidirectional data path to the second page buffer and to the input/output data path, the second page buffer and the third buffer including storage cells, the first page buffer and the second page buffer having respective widths of at least one page width, the method comprising:
moving error corrected data of a first page from the third buffer to the data path, moving data of a second page from storage cells in the first page buffer to storage cells in the second page buffer in one cycle and then from storage cells in the second page buffer to storage cells in the third buffer, and moving data of a third page from the memory array to storage cells in the first page buffer, and applying the ECC logic for error detection to data of pages in the sequence before the data is moved out of storage cells in the second page buffer,
wherein the third buffer comprises a first memory unit coupled to the second page buffer and coupled to the data path, and a second memory unit coupled to the second page buffer and coupled to the data path, the method further comprising:
during a first time period, moving error corrected data of a first page from the first memory unit to the data path followed by a wait time, moving data of a second page from the first page buffer to the second page buffer and then from the second page buffer to the second memory unit, and moving data and corresponding ECCs for a third page from the memory array to the first page buffer;
during a second time period subsequent to the first time period, moving error corrected data of the second page from the second memory unit to the data path followed by the wait time, moving data of the third page from the first page buffer to the second page buffer and then from the second page buffer to the first memory unit, and moving data and corresponding ECCs for a fourth page from the memory array to the first page buffer;
applying the ECC logic for error correction to data of pages in the sequence before the data is moved out of the third buffer or while the data is moved from one of the first memory unit and the second memory unit to the data path; and
repeating said moving steps during the first time period and the second time period for reading more data pages.

11. The method of claim 10, during an initial time period prior to the first time period, further comprising:
moving data and corresponding ECCs for the first page from the memory array to the first page buffer, moving data of the first page from the first page buffer to the second page buffer and then from the second page buffer to the first memory unit, and moving data and corresponding ECCs for the second page from the memory array to the first page buffer; and
applying the ECC logic for error correction to data of pages in the sequence in the initial time period before the data is moved out of the third buffer or while the data is moved from the third buffer to the data path.

12. The method of claim 10, further comprising:
during a time period, moving error corrected data of a first page from the third buffer to the data path followed by a wait time, moving data of a second page from the first page buffer to the second page buffer, moving error corrected data from the second page buffer to the third buffer, and moving data and corresponding ECCs for a third page from the memory array to the first page buffer; and applying the ECC logic for error correction to data of pages in the sequence in the time period before the data is moved out of the second page buffer, repeating said moving steps during the time period for reading more data pages.

13. The method of claim 12, during an initial time period prior to the time period, further comprising:

moving data and corresponding ECCs for the first page from the memory array to the first page buffer, moving data of the first page from the first page buffer to the second page buffer, and moving error corrected data of the first page from the second page buffer to the third buffer;

moving data and corresponding ECCs for the second page from the memory array to the first page buffer after data of the first page is moved from the first page buffer to the second page buffer; and applying the ECC logic for error correction to data of pages in the sequence in the initial time period before the data is moved out of the second page buffer.

14. The method of claim 10, further comprising in an operation when the ECC logic is disabled:

during a first time period, moving data of a first page from the third buffer to the data path, and moving data of a second page from the memory array to the first page buffer;

during a second time period subsequent to the first time period, moving data of the second page from the first page buffer to the second page buffer and then from the second page buffer to the third buffer, and moving data of a third page from the memory array to the first page buffer, and repeating said moving steps during the first time period and the second time period for reading more data pages.

15. A method of operating a memory device, the memory device comprising a memory array storing data and error correcting codes ECCs corresponding to the data and including a plurality of data lines for page mode operations, a multi-level buffer structure between the memory array and an input/output data path, wherein the buffer structure includes a first page buffer having storage cells connected to respective data lines in the plurality of data lines for a page of data, a second page buffer connected through a first bidirectional data path to the storage cells in the first page buffer for storing at least one page of data, and a third buffer connected through a second bidirectional data path to the second page buffer and to the input/output data path, the second page buffer and the third buffer including storage cells, the first page buffer and the second page buffer having respective widths of at least one page width, the method comprising:

moving data of a first page from storage cells in the first page buffer to the memory array with ECCs computed by ECC logic, moving data of a second page from the data path to storage cells in the third buffer, moving data of the second page from storage cells in the third buffer to storage cells in the second page buffer, moving data of the second page from storage cells in the second page buffer to storage cells in the first page buffer in one cycle, and applying the ECC logic to compute an ECC for data of pages in the sequence before the data is moved out of the second page buffer, wherein the third buffer comprises a first memory unit coupled to the second page buffer and coupled to the data path, and a second memory unit coupled to the second page buffer and coupled to the data path, the method further comprising:

during a first time period, moving data of a second page from the data path to the first memory unit, moving data of the second page from the first memory unit to the second page buffer with ECCs computed by the ECC logic, moving data of a first page out of the first page buffer to the memory array with the ECCs, and moving data of the second page from the second page buffer to the first page buffer;

during a second time period subsequent to the time period, moving data of a third page from the data path to the second memory unit, moving data of the third page from the second memory unit to the second page buffer with ECCs computed by the ECC logic, moving data of the second page out of the first page buffer to the memory array with the ECCs, and moving data of the third page from the second page buffer to the first page buffer;

applying the ECC logic to compute an ECC for data of pages in the sequence before the data is moved out of the second page buffer; and repeating said moving steps during the first time period and the second time period for writing more data pages.

16. The method of claim 15, during an initial time period prior to the first time period, further comprising:

moving data of an initial page from the data path to the first memory unit, moving data of the initial page from the first memory unit to the second page buffer with ECCs computed by the ECC logic, moving data of the initial page from the second page buffer to the first page buffer, and moving data of the initial page out of the first page buffer to the memory array with the ECCs;

after data of the initial page is moved to the first memory unit, moving data of the first page from the data path to the second memory unit, moving data of the first page from the second memory unit to the second page buffer with ECCs computed by the ECC logic, and moving data of the first page from the second page buffer to the first page buffer; and applying the ECC logic to compute an ECC for data of pages in the sequence before the data is moved out of the second page buffer.

17. The method of claim 15, further comprising:

during a time period, moving data of a first page out of storage cells in the first page buffer to the memory array with ECCs computed by the ECC logic, moving data of a second page from the data path to storage cells in the third buffer, moving data of the second page from storage cells in the third buffer to storage cells in the second page buffer, and moving data of the second page from storage cells in the second page buffer to storage cells in the first page buffer;

applying the ECC logic to compute an ECC for data of pages in the sequence before the data is moved out of storage cells in the second page buffer; and repeating said moving steps during the time period for writing more data pages.

18. The method of claim 17, during an initial time period prior to the time period, further comprising:

moving data of an initial page from the data path to storage cells in the third buffer, moving data of the initial page from storage cells in the third buffer to storage cells in the second page buffer, moving data of the initial page from storage cells in the second page buffer to storage cells in the first page buffer, and moving data of the initial page out of storage cells in the first page buffer to the memory array with ECCs computed by the ECC logic;

after data of the initial page is moved from storage cells in the third buffer to storage cells in the second page buffer, moving data of the first page from the data path to storage cells in the third buffer, moving data of the first page from storage cells in the third buffer to storage cells in the second page buffer, and moving data of the first page from storage cells in the second page buffer to storage cells in the first page buffer; and applying the ECC logic to compute an ECC for data of pages in the sequence before the data is moved out of storage cells in the second page buffer.

* * * * *